United States Patent [19]
Inoue

[11] Patent Number: 5,914,622
[45] Date of Patent: Jun. 22, 1999

[54] PULSE-WIDTH CONTROLLER

[75] Inventor: Tadao Inoue, Kawasaki, Japan

[73] Assignee: Fujitsu Limited, Kawasaki, Japan

[21] Appl. No.: 08/869,758

[22] Filed: Jun. 5, 1997

[30] Foreign Application Priority Data

Nov. 27, 1996 [JP] Japan ................................ 8-316768

[51] Int. Cl.$^6$ .............................. H03K 3/00; G05F 1/10
[52] U.S. Cl. .......................... 327/172; 327/175; 327/20; 327/18
[58] Field of Search .................................. 327/172, 173, 327/174, 175, 176, 20, 18

[56] References Cited

U.S. PATENT DOCUMENTS 5,572,158 11/1996 Lee et al. .............................. 327/175

FOREIGN PATENT DOCUMENTS 6-291626 10/1994 Japan .

Primary Examiner—Timothy P. Callahan
Assistant Examiner—Dinh Le
Attorney, Agent, or Firm—Staas & Halsey

[57] ABSTRACT

There is disclosed a pulse-width controller which includes a first pulse-width adjusting section which adjusts the pulse width of a main pulse signal, a second pulse-width adjusting section which adjusts the pulse width of a reference pulse signal, a pulse-width measurement section which measures the pulse width of the reference pulse signal adjusted by the second pulse-width adjusting section, a target pulse-width setting section for setting a target pulse width to be achieved by the first pulse-width adjusting section, and a control section which outputs to the first pulse-width adjusting section a control signal for use in adjusting the pulse width of the main pulse signal in the first pulse-width adjusting section, on the basis of pulse-width information regarding the reference pulse signal measured in the pulse-width measurement section and the target pulse-width information set by the target pulse-width setting section. It becomes possible to precisely control a pulse width without being affected by the ambient state at the time of pulse-width control operations.

61 Claims, 17 Drawing Sheets

PULSE-WIDTH CONTROLLER

BACKGROUND OF THE INVENTION

(1) Field of the Invention

The present invention relates to a pulse-width controller suitable for use in an electronic apparatus which uses pulses; e.g., a digital circuit, a pulse-width modulation circuit, or a light-emitting element drive circuit.

(2) Description of the Related Art

In an optical communications system or an optical disk system, control is necessary to ensure a constant pulse width as well as a constant pulse amplitude in order to reduce an error rate associated with communication and writing of data.

FIG. 16 is a schematic representation illustrating the operation of a common pulse-width controller. The pulse-width controller illustrated in FIG. 16 is provided with a pulse-width adjusting section 30. This pulse-width adjusting section 30 adjusts the pulse width of input data according to a control signal input from a control terminal; namely, d.c. voltage (DC voltage), d.c. current (DC current), or a resistance connected to the control terminal. Upon reception of a data signal, the data pulse-width adjusting section 30 outputs, according to a control signal input from the control terminal, a data signal having a target pulse width.

However, the characteristics of components constituting the previously described common pulse-width controller vary according to temperature and voltage of the power source. Moreover, they also vary depending on the individual difference of the components; for example, the individual difference of an IC (integrated circuit) or LSI (large scale integrated circuit) due to the influence of the degree of reproducibility of a process and the uniformity of the surface of a wafer.

In a case where a pulse-width controller is constituted of such circuit components, even if a DC current or DC voltage input to the control terminal of the pulse-width adjusting section 30 or a resistance connected to the control terminal of the same is maintained constant, the pulse width of resultantly-output data signal changes with factors such as the environment (conditions 1 and 2) when the pulse-width control is performed as designated by arrows A and B in FIG. 16. As a result, it becomes impossible to precisely control the pulse width.

Further, as shown in FIG. 17, it is also conceivable that, in a pulse-width control apparatus comprising the pulse-width adjusting section 30 followed by an electrical-optical signal converter (E/O signal converter) 32 which converts an electrical signal to an optical signal, the output received from the pulse-width adjusting section 30 is compared with a predetermined reference value by a comparator 31. The pulse-width adjusting section 30 adjusts the pulse width of output data according to the result of such comparison, thereby making the pulse width stable.

With such a circuit configuration, it is possible to maintain the pulse width constant in a case where a data signal is continuously input. However, in the case of a burst mode signal (e.g., communications employed with respect to optical subscribers of CATV), a data signal is input intermittently; more specifically, there arises a difference between the state in which input of the data signal is interrupted for a given period of time and the state in which there is an input of the data signal, thereby making it impossible to produce a stable pulse width.

SUMMARY OF THE INVENTION

The present invention has been conceived in view of the foregoing drawbacks, and an object of the present invention is to provide a pulse-width controller capable of precisely controlling a pulse width without being affected by the ambient state of the pulse-width controller at the time of pulse-width control operations or by the presence or absence of data.

To this end, the present invention provides a pulse-width controller comprising: a first pulse-width adjusting section which adjusts the pulse width of a main pulse signal upon reception thereof; a second pulse-width adjusting section which adjusts the pulse width of a reference pulse signal upon reception thereof; a pulse-width measurement section which, upon reception of an output from the second pulse-width adjusting section, measures the pulse width of the reference pulse signal adjusted by the second pulse-width adjusting section; a target pulse-width setting section for setting a target pulse width to be achieved by the first pulse-width adjusting section; and a control section which outputs to the first pulse-width adjusting section a control signal for use in adjusting the pulse width of the main pulse signal in the first pulse-width adjusting section, on the basis of pulse-width information regarding the reference pulse signal measured in the pulse-width measurement section and the target pulse-width information set by the target pulse-width setting section.

Therefore, according to the pulse-width controller of the present invention, the pulse width of the data signal can be controlled by the second pulse-width adjusting section that is provided so as to simulate the first pulse-width adjusting section. As a result, precise pulse-width control operations can be carried out regardless of the ambient state of the pulse-width controller at the time of pulse-width control operations, thereby contributing to improved performance of the pulse-width controller.

According to a first aspect of the present invention, there is provided a pulse-width controller of the present invention comprising: a first pulse-width adjusting section which adjusts the pulse width of a main electrical pulse signal upon reception thereof; a first electrical-optical signal conversion section for converting into an optical signal information regarding the main electrical pulse signal whose pulse width has been controlled by the first pulse-width adjusting section; a second pulse-width adjusting section which adjusts the pulse width of a reference electrical pulse signal upon reception thereof; a pulse-width measurement section which, upon reception of an output from the second pulse-width adjusting section, measures the pulse width of the reference pulse signal adjusted by the second pulse-width adjusting section; a target pulse-width setting section for setting a target pulse width to be achieved by the first pulse-width adjusting section; and a control section which outputs to the first pulse-width adjusting section a control signal for use in adjusting the pulse width of the main pulse signal in the first pulse-width adjusting section, on the basis of the pulse-width information regarding the reference pulse signal measured in the pulse-width measurement section and the target pulse-width information set by the target pulse-width setting section.

Accordingly, in the present invention, the pulse width of the data signal can be controlled by use of information regarding the difference between the target pulse width information and pulse width information obtained from the pulse width of the clock signal used in inputting the data signal, thereby allowing more precise pulse-width control operations.

According to a second aspect of the present invention, there is provided a pulse-width controller comprising: a selection switch for enabling selective output of either a main pulse signal or a reference pulse signal; a pulse-width adjusting section which, upon reception of the pulse signal thus output from the selection switch, adjusts the pulse width of the signal; a pulse signal output section capable of allowing external output of a signal received from the pulse-width adjusting section; a pulse-width measurement section which, upon reception of an output from the pulse-width adjusting section, measures the pulse width of the pulse signal adjusted by the pulse-width adjusting section; a target pulse-width setting section for setting a target pulse width to be achieved by the pulse-width adjusting section; a control section which outputs a control signal for use in adjusting the pulse width of the pulse signal in the pulse-width adjusting section, on the basis of the pulse-width information regarding the pulse signal measured in the pulse-width measurement section and the target pulse-width information set by the target pulse-width setting section; and a storage section capable of storing the control signal received from the control section and outputting the thus-stored control signal to the pulse-width adjusting section.

According to a third aspect of the present invention, there is provided a pulse-width controller comprising: a selection switch for selectively outputting one of an electrical pulse signal and a reference electrical pulse signal; a pulse-width adjusting section which, upon reception of the electrical pulse signal thus output from the selection switch, adjusts the pulse width of the signal; an electrical-optical signal conversion section for converting into an optical signal information regarding the electrical pulse signal whose pulse width has been adjusted by the pulse-width adjusting section and for allowing the output from the pulse-width adjusting section to be output to the outside as an optical signal; an optical-electrical signal conversion section for converting the optical signal received from the electrical-optical signal conversion section into an electrical signal; a pulse-width measurement section which, upon reception of an output from the optical-electrical signal conversion section, measures the pulse width of the electrical pulse signal adjusted by the pulse-width adjusting section; a target pulse-width setting section for setting a target pulse width to be achieved by the pulse-width adjusting section; a control section which outputs a control signal for use in adjusting the pulse width of the electrical pulse signal in the pulse-width adjusting section, on the basis of the pulse-width information regarding the electrical pulse signal measured in the pulse-width measurement section and the target pulse-width information set by the target pulse-width setting section; and a storage section capable of storing the control signal received from the control section and outputting the thus-stored control signal to the pulse-width adjusting section.

Accordingly, in the present invention, since the pulse widths of the clock signal and data signal are controlled by one pulse-width adjusting section, it is possible to control the pulse width of the signals without being affected by the individual difference of the pulse-width adjusting section itself. Moreover, the circuit configuration of the pulse-width controller can be made compact. A control signal output from a comparison device (a comparing circuit, a comparator) is stored in the storage section, and the clock signal can be controlled by feeding back the thus-stored information. Similarly, the pulse width of a signal can be controlled more accurately by causing the control signal to follow the pulse width to be output. Consequently, the performance of the pulse-width controller is greatly improved.

DESCRIPTION OF THE PREFERRED EMBODIMENTS (a) Description of the Aspects of the Present Invention With reference to the accompanying drawings, the aspects of the present invention will be described.

Figure 1:
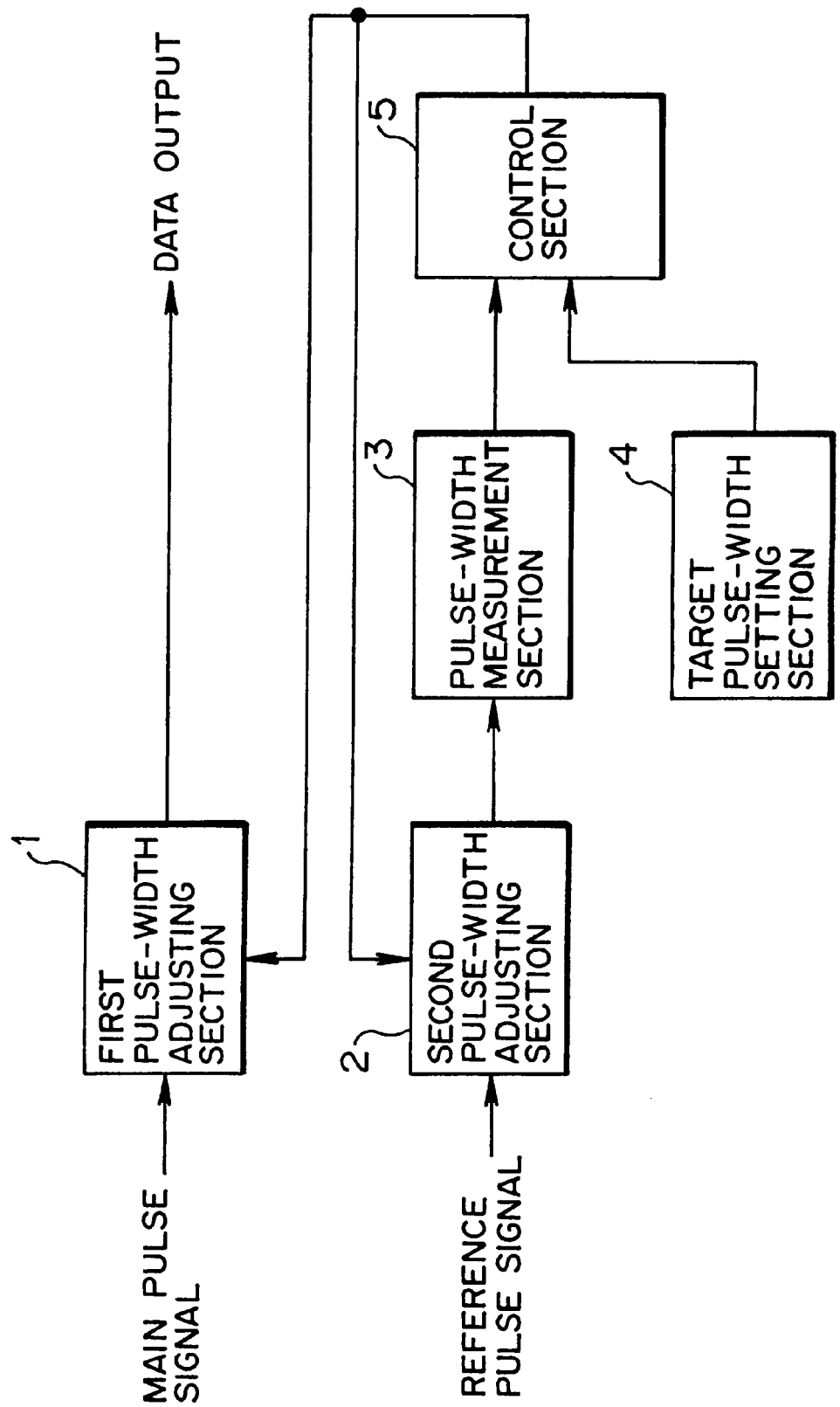
FIG. 1 is a block diagram illustrating an aspect of the present invention.

FIG. 1 is a block diagram illustrating an aspect of the present invention. In FIG. 1, reference numeral 1 designates a first pulse-width adjusting section; 2 designates a second pulse-width adjusting section; 3 designates a pulse-width measurement section; 4 designates a target pulse-width setting section; and 5 designates a control section.

The first pulse-width control section 1 receives a main pulse signal and adjusts the pulse width of the pulse signal. The second pulse-width adjusting section 2 receives a reference pulse signal and adjusts the pulse width of the pulse signal.

The pulse-width measurement section 3 receives an output from the second pulse-width adjusting section 2 and measures the pulse width of the reference pulse signal adjusted by the second pulse-width adjusting section 2. The target pulse width setting section 4 sets a target pulse width to be achieved by the first pulse-width adjusting section 1.

Further, the control section 5 outputs to the first pulse-width adjusting section 1 a control signal for use in adjusting the pulse width of the main pulse signal in the first pulse-width adjusting section 1 on the basis of pulse-width information regarding the reference pulse signal measured by the pulse-width measurement section 3 and the target pulse-width information set by the target pulse-width setting section 4.

For example, the previously described main pulse signal may be a data signal, and the reference pulse signal may be a clock signal.

Upon reception of the control signal in the form of a feedback signal from the control section 5 which will be described later, the previously described second pulse-width adjusting section 2 can also adjust the pulse width of the reference pulse signal.

Therefore, according to the previously described pulse-width controller of the present invention, the pulse width of the data signal can be adjusted by the second pulse-width adjusting section 2 that is provided so as to simulate the first pulse-width adjusting section 1. As a result, precise pulse-width control operations can be carried out regardless of the ambient state of the pulse-width controller at the time of pulse-width control operations, thereby contributing to improved performance of the pulse-width controller.

Further, according to the present invention, the pulse width of the clock signal can be controlled by feeding back the control signal output from the comparison device (i.e., the comparing circuit). Therefore, the pulse width of the data signal can be controlled more accurately by causing the control signal to follow the pulse width to be output. Even in this case, the performance of the pulse-width controller is greatly improved.

Figure 2:
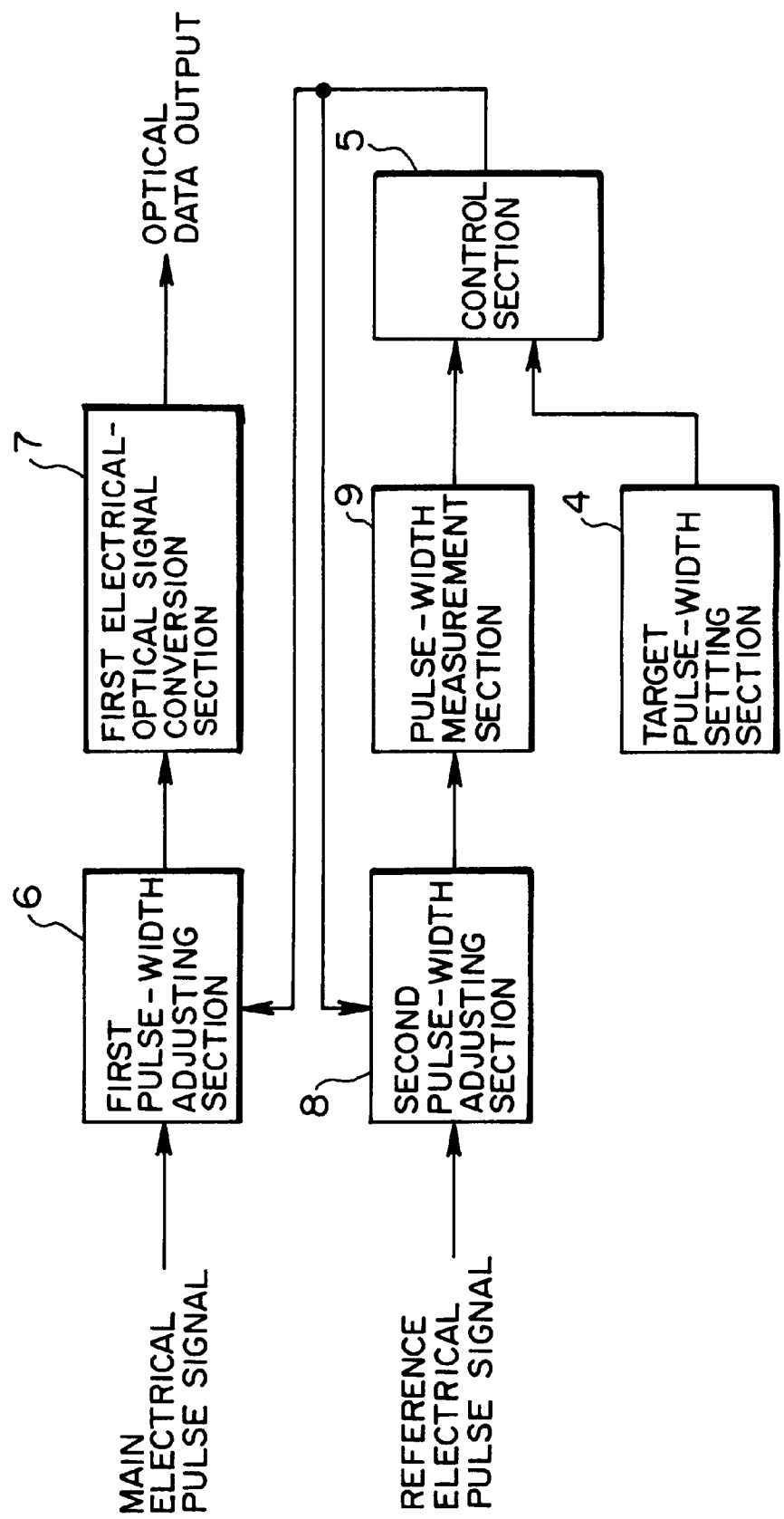
FIG. 2 is a block diagram illustrating another aspect of the present invention.

FIG. 2 is a block diagram illustrating another aspect of the present invention. In FIG. 2, reference numeral 4 designates a target pulse-width setting section; 5 designates a control section; 6 designates a first pulse-width adjusting section; 7 designates a first electrical-optical signal conversion section; 8 designates a second pulse-width adjusting section; and 9 designates a pulse-width measurement section. Other previously-described reference numerals designate the same or substantially the same elements as those described above, and hence their explanations will be omitted here.

The first pulse-width adjusting section 6 receives a main electrical pulse signal and adjusts the pulse width of the pulse signal, and the first electrical-optical signal conversion section 7 converts into an optical signal information regarding the main electrical pulse signal whose pulse width has been adjusted by the first pulse-width adjusting section 6.

Further, the second pulse-width adjusting section 8 receives a reference electrical pulse signal and adjusts the pulse width of the pulse signal. The pulse-width measurement section 9 receives an output from the second pulse-width adjusting section 8 and measures the pulse width of the reference pulse signal adjusted by the second pulse-width adjusting section 8.

For example, the previously described main electrical pulse signal may be a transmission data signal, and the reference electrical pulse signal may be a clock signal.

The previously described second pulse-width adjusting section 8 can receive the control signal in the form of a feedback signal from the control section 5, which will be described later, so as to control the pulse width of the reference electrical pulse signal.

Accordingly, in the present invention, the pulse width of the data signal can be controlled by use of information regarding the difference between pulse width information obtained from the pulse width of the clock signal used in inputting the data signal and the target pulse width information, thereby allowing more precise pulse-width control operations.

According to the present invention, the pulse width of the clock signal can be controlled by feeding back the control signal output from the comparison circuit (a comparing circuit, a comparator), and hence the pulse width of the data signal can be controlled more accurately by causing the control signal to follow the pulse width to be output. Even in this case, the performance of the pulse-width controller is greatly improved.

Moreover, the first and second pulse-width adjusting sections 1 and 2 illustrated in FIG. 1 should preferably be formed by identical or substantially identical circuits. Similarly, the first and second pulse-width adjusting sections 6 and 8 illustrated in FIG. 2 should preferably be formed by identical or substantially identical circuits. With such a configuration, it is desirable to mount the first and second pulse-width adjusting sections 1 and 2, and the first and second pulse-width adjusting sections 6 and 8 on one single semiconductor substrate, respectively.

Output stages of the second pulse-width adjusting sections 2 and 8 may also be formed into a CMOS logic circuit. In this case, the previously described pulse-width measurement sections 3 and 9 may be provided with a low-pass filer.

Further, the target pulse-width setting section 4 may be provided with a power source circuit that generates a voltage corresponding to the target pulse width. In this case, the power source circuit may be provided with a constant voltage source and a resistor-type voltage divider circuit for dividing the voltage of the constant voltage source into a voltage corresponding to the target pulse width. Moreover, the voltage divider circuit may include a variable resistor or a thermistor.

The control section 5 may be provided with a comparator which outputs, as a control signal, information regarding the difference between the output information from the pulse-width measurement section 3 or 9 and the target pulse-width information set by the target pulse-width setting section 4. In this case, the comparator may be formed into a differential amplifier circuit for obtaining the information regarding the difference.

In addition, there may be provided a frequency divider for dividing the frequency of the reference pulse signal input to the second pulse-width adjusting section 2. Similarly, there may be provided a frequency divider for dividing the reference electrical pulse signal input to the second pulse-width adjusting section 8.

Accordingly, in the present invention, the pulse width of the data signal can be controlled by use of information regarding the difference between the target pulse width information and pulse width information obtained from the pulse width of the clock signal used in inputting the data signal, thereby allowing more precise pulse-width control operations.

Between the second pulse-width adjusting section 8 and the pulse-width measurement section 9, there may be provided a second electrical-optical signal conversion section for converting into an optical signal information (or an electrical signal) output from the second pulse-width adjusting section 8, as well as an optical-electrical signal conversion section for converting into an electrical signal the optical signal received from the second electrical-optical signal conversion section.

The first electrical-optical signal conversion section 7 may be composed of a light-emitting element and a light-emitting element drive section for driving the light-emitting element. In this case, the light-emitting element may be formed by a semiconductor laser.

The second electrical-optical signal conversion section may be composed of a light-emitting element and a light-emitting element drive section for driving the light-emitting element. Even in this case, the light-emitting element may be similarly formed by a semiconductor laser.

Further, the optical-electrical signal conversion section may be composed of a light-receiving element and an amplifier for amplifying an output of the light-receiving element. In this case, the light-receiving element may be formed by a photodiode.

Accordingly, in the present invention, the second electrical-optical signal conversion section and the optical-electrical signal conversion section are interposed between the second pulse-width adjusting section 8 and the pulse-width measurement section 9. Therefore, the processing carried out by the second pulse-width adjusting section 8 and the second electrical-optical signal conversion section can be caused to simulate the processing carried out by the first pulse-width adjusting section 6 and the first electrical-optical signal conversion section 7. There can be corrected the dependency of the pulse-width controller with respect to temperature and power source (or the degree of influence of the temperature and the power source), including the characteristics of the light-emitting element.

Figure 3:
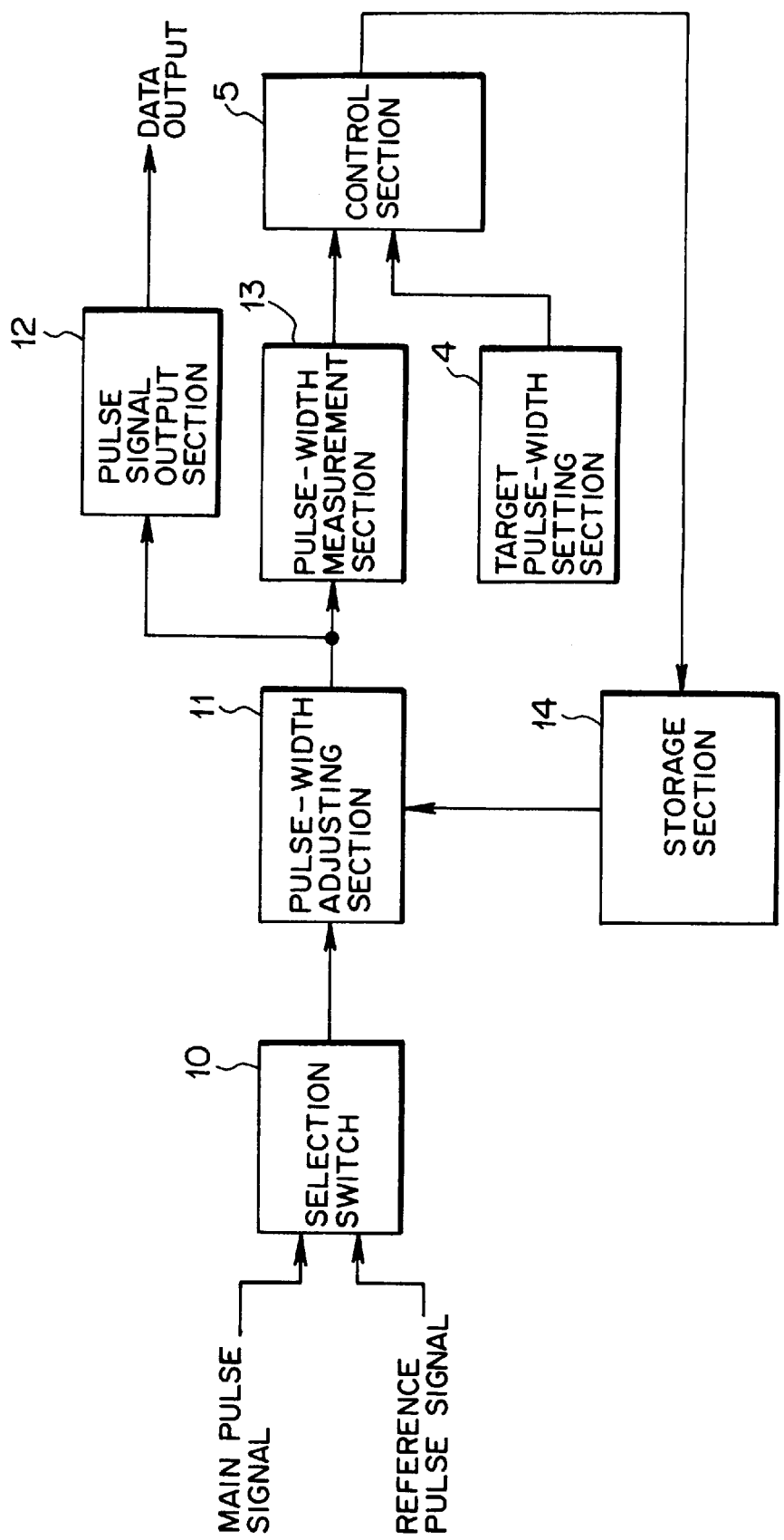
FIG. 3 is a block diagram illustrating yet another aspect of the present invention.

FIG. 3 is a block diagram illustrating yet anther aspect of the present invention. In FIG. 3, reference numeral 4 designates a target pulse-width setting section; 5 designates a control section; 10 designates a selection switch; 11 designates a pulse-width adjusting section; 12 designates a pulse-width output section; 13 designates a pulse-width measurement section; and 14 designates a storage section. Other previously-described reference numerals designate the same or substantially the same elements as those described above, and hence their explanations will be omitted here.

The selection switch 10 enables selective output of either a main pulse signal or a reference pulse signal. The pulse-width adjusting section 11 receives the pulse signal thus output from the selection switch 10 and adjusts the pulse width of the selected one of the pulse signal.

The pulse signal output section 12 is capable of allowing external output of a signal received from the pulse-width adjusting section 11. The pulse-width measurement section 13 receives an output from the pulse-width adjusting section 11 and measures the pulse width of the pulse signal adjusted by the pulse-width adjusting section 11. The storage section 14 is capable of storing the control signal received from the control section 5 and outputting the thus-stored control signal to the pulse-width adjusting section 11.

For example, the main pulse signal may be a data signal, and the reference pulse-width signal may be a clock signal.

Figure 4:
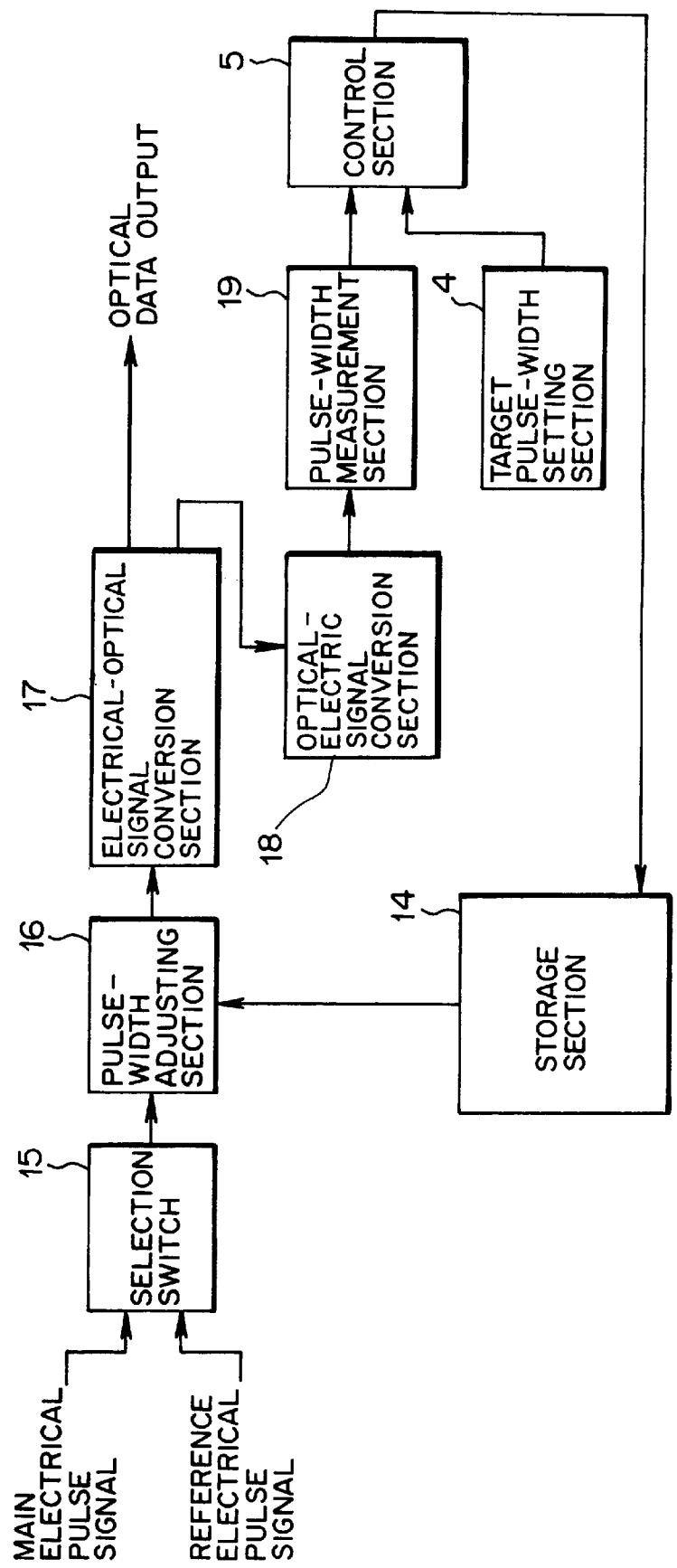
FIG. 4 is a block diagram illustrating still another aspect of the present invention.

FIG. 4 is a block diagram illustrating still another aspect of the present invention. In FIG. 4, reference numeral 4 designates a target pulse-width setting section; reference numeral 14 designates a storage section; 15 designates a selection switch; 16 designates pulse-width adjusting section; 17 designates an electrical-optical signal conversion section; 18 designates an optical-electrical signal conversion section; and 19 designates a pulse-width measurement section. Other previously-described reference numerals designate the same or substantially the same elements as those described above, and hence their explanations will be omitted here.

The selection switch 15 enables selective output of either an electrical pulse signal or a reference electrical pulse signal. The pulse-width adjusting section 16 receives the electrical pulse signal thus output from the selection switch and adjusts the pulse width of the signal.

Further, the electrical-optical signal conversion section 17 is capable of converting into optical signal information regarding the electrical pulse signal whose pulse width has been adjusted by the pulse-width adjusting section 16 and allowing external output of the signal from the pulse-width adjusting section 16 in the form of an optical signal.

The optical-electrical signal conversion section 18 converts the optical signal received from the electrical-optical signal conversion section 17 into an electrical signal. The pulse-width measurement section 19 receives an output from the optical-electrical signal conversion section 18 and measures the pulse width of the electrical pulse signal adjusted by the pulse-width adjusting section 16.

For example, the previously-described main electrical pulse signal may be a transmission data signal, and the reference electrical pulse signal may be a clock signal.

Further, the output stages of the previously described pulse-width adjusting sections 11 and 16 may be formed into a CMOS logic circuit. In this case, each of the pulse-width measurement sections 13 and 19 may be respectively provided with a low-path filter.

The target pulse-width setting section 4 may be provided with a power source circuit which produces a voltage corresponding to the target pulse width. In this case, the power source circuit may be provided with a constant voltage source and a voltage divider circuit for dividing the voltage of the constant voltage source by the resistance corresponding to the target pulse width. Moreover, the voltage divider circuit may include a variable resistor or a thermistor.

The control section 5 may be provided with a comparator which outputs, as a control signal, information regarding the difference between the output information from the pulse-width measurement section 13 or 19 and the target pulse-width information set by the target pulse-width setting section 4. In this case, the comparator may be formed into a differential amplifier circuit for obtaining the information regarding the difference between the output information from the pulse-width measurement section 13 or 19 and the target pulse-width information set by the target pulse-width setting section 4.

In addition, there may be provided a frequency divider for dividing the frequency of the reference pulse signal input to the pulse-width adjusting section 11. Similarly, there may be provided a frequency divider for dividing the reference electrical pulse signal input to the pulse-width adjusting section 16.

Accordingly, in the present invention, since the pulse widths of the clock signal and data signal are controlled by one pulse-width adjusting section 16, it is possible to control the pulse width of the signals without being affected by the individual difference of the pulse-width adjusting section 16 itself. In addition, the circuit configuration of the pulse-width controller can be made compact. It is possible to store in the control section a control signal output from a comparison device (a comparing circuit) and to control the clock signal by feeding back the thus-stored information. Similarly, the pulse width of a signal can be controlled more accurately by causing the control signal to follow the pulse width to be output. Consequently, the performance of the pulse-width controller is greatly improved.

The electrical-optical signal conversion section 17 may be composed of a light-emitting element and a light-emitting element drive section for driving the light-emitting element. In this case, the light-emitting element may be formed by a semiconductor laser. Further, the optical-electrical signal conversion section 18 may be composed of a light-receiving element and an amplifier for amplifying an output of the light-receiving element. In this case, the light-receiving element can be formed by a photodiode.

Accordingly, in the present invention, the electrical-optical signal conversion section 17 and the optical-electrical signal conversion section 18 are provided subsequent to the pulse-width adjusting section 16. Consequently, it is possible to correct variations in pulse width arising over a medium/long period of time due to the temperature, power source voltage, and individual difference of the pulse-width controller that include the characteristics of the light-emitting element.

(b) Description of the First Embodiment of the Present Invention

With reference to the accompanying drawings, a first embodiment of the present invention will be described.

Figure 5:
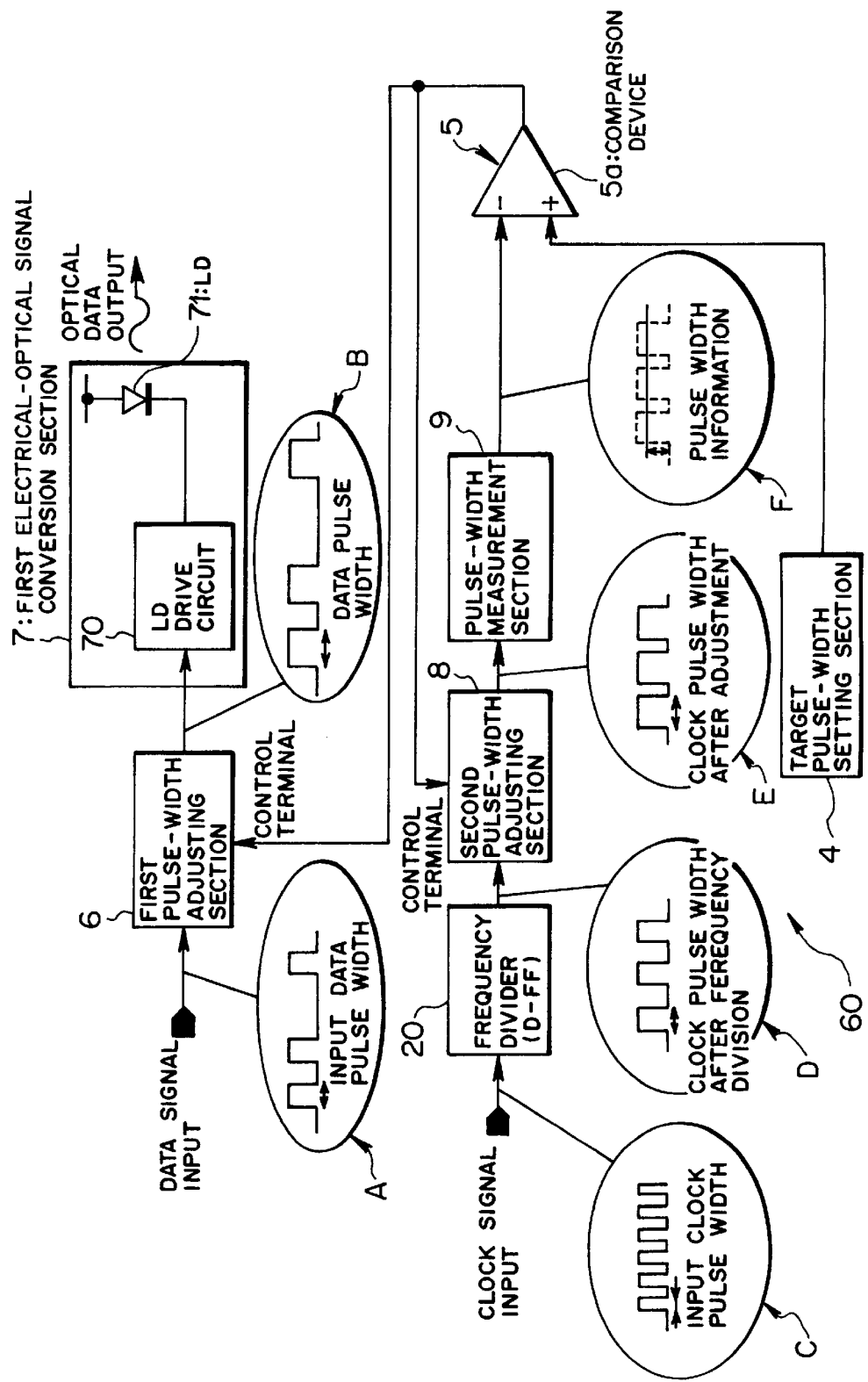
FIG. 5 is a block diagram illustrating the configuration of a pulse-width controller according to a first embodiment of the present invention.

FIG. 5 is a block diagram illustrating the configuration of a pulse-width controller according to the first embodiment of the present invention. A pulse-width controller 60 illustrated in FIG. 5 is used in writing data into an optical disk as well as in optical communications and is comprised of a target pulse-width setting section 4, a comparison device 5a, a first pulse-width adjusting section 6, a first electrical-optical signal conversion section 7, a second pulse-width adjusting section 8, a pulse-width measurement section 9, and a frequency divider 20.

The first pulse-width adjusting section 6 receives a transmission data signal (hereinafter often referred simply to as a "data signal") as a main electrical pulse signal and adjusts the pulse width of the thus-received data signal. The pulse width of the input data signal (designated by arrow A in FIG. 5) is controlled by use of a control signal (designated by arrow B in FIG. 5) input from the comparison device 5a through a control terminal. The first pulse-width adjusting section 6 has a circuit configuration as disclosed in; e.g., FIG. 7. The circuit disclosed in FIG. 7 will be described later.

The first optical-electrical signal conversion section 7 converts into an optical signal information regarding the data signal (an electrical signal) whose pulse width controlled by the first pulse-width adjusting section 6. The first optical-electrical signal conversion section 7 is comprised of a laser diode drive circuit (an LD drive circuit; or a light-emitting element drive section) 70 and a laser diode 71 (LD) serving as a light-emitting element.

The LD drive circuit 70 drives the LD 71. The LD 71 produces an optical signal by means of a drive current received from the LD drive circuit 70. For example, the LD 71 is formed by a semiconductor laser. The optical data output is produced from the LD 71.

The pulse width of an optical pulse signal output from the LD 71 has such characteristics as to become narrower than the pulse width of an electrical current pulse received from the previously-described first pulse-width adjusting section 6. For this reason, the first pulse-width adjusting section 6 previously makes the pulse width of the electrical current pulse wide.

The frequency divider 20 divides the frequency of a clock signal used as a reference electrical pulse signal (for example, it produces a signal whose frequency is half that of the clock signal). The clock signal whose frequency is thus divided is output to the second pulse-width control signal 8. More specifically, the frequency divider 20 divides the frequency of a clock signal (see arrow C in FIG. 5) which establishes timing of the data signal input to the previously-described pulse-width controller 60, and a resultant signal is output to the second pulse-width adjusting section 8 (see arrow D in FIG. 5).

Further, for example, a NRZ (Non-Return-to-Zero) signal can be used as the data signal. In such a case, since the data signal and the clock signal are different in pulse width from each other, it is possible to cause the clock signal to have the same pulse width as that of the data signal by dividing the pulse width of the clock signal with use of the frequency divider 20. In this case, the higher degree of similarity between the first pulse-width adjusting section 6 and the second pulse-width adjusting section 8, more accurate control can be effected.

The NRZ signal can be handled as the data signal without use of the frequency divider 20. However, in this case, because the data signal and the clock signal are different in pulse width from each other, it is desirable that, upon reception of a control signal from the comparison device 5a, the first pulse-width adjusting section 6 should control the pulse width of the data signal by converting the data signal with use of a control coefficient. This case is effective only if there is a known tendency with regard to variations in the pulse width of the data output from the two pulse-width adjusting sections (i.e., the first and second pulse-width adjusting sections 6 and 8).

The second pulse-width adjusting section 8 receives the clock signal and controls its pulse width. As a result of reception of a control signal in the form of a feedback signal from the comparison device 5 which will be described later, the pulse width of the clock signal is controlled (see arrow E in FIG. 5). Here, this second pulse-width adjusting section 8 also has the circuit configuration illustrated in FIG. 7 in the same way as does the previously-described first pulse-width adjusting section 6, and hence its explanation will be omitted here.

Figure 6:
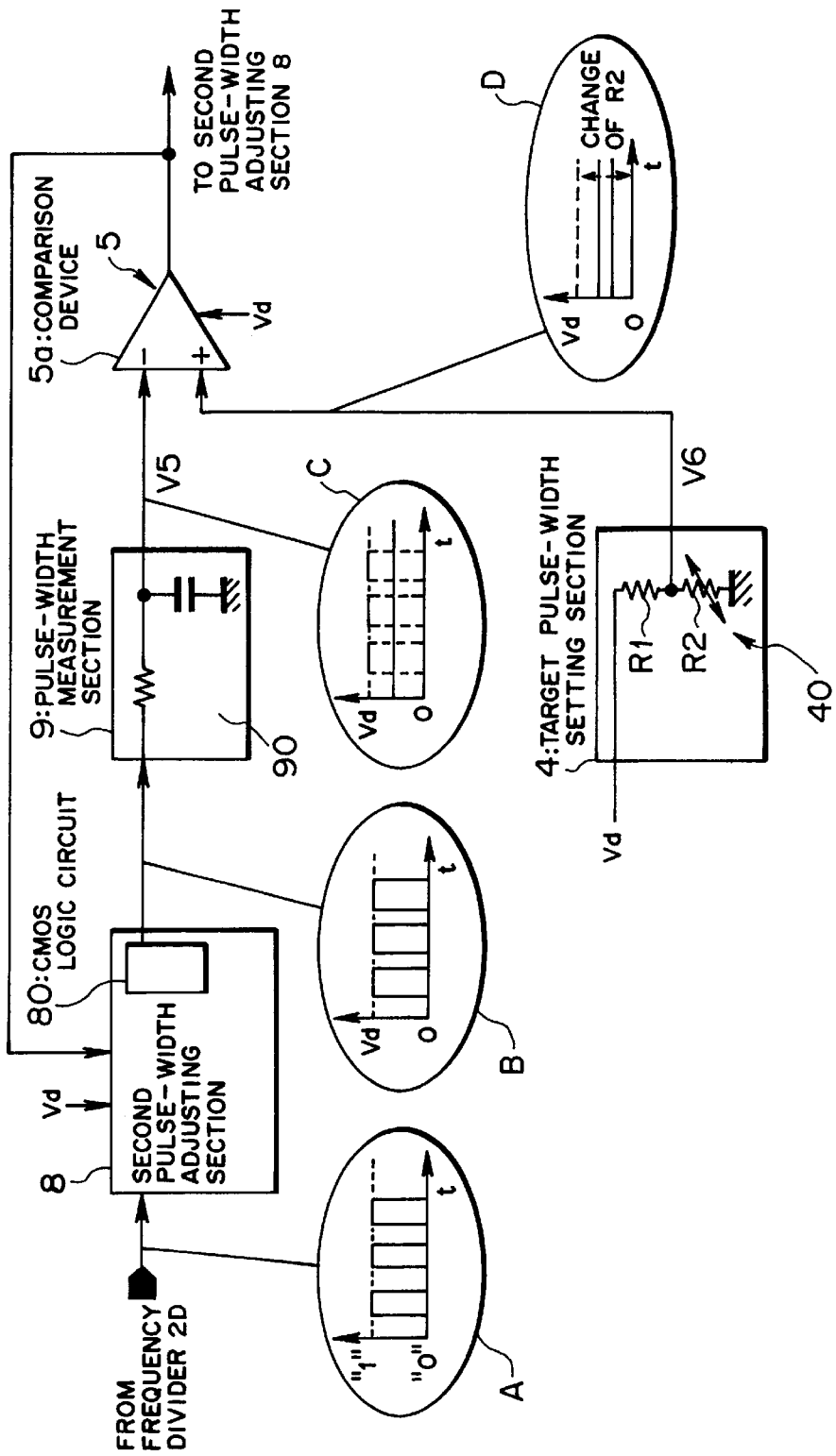
FIG. 6 is a block diagram illustrating the details of the pulse-width controller of the first embodiment of the present invention.

As illustrated in FIG. 6, a CMOS (Complementary MOS) logic circuit (an inverter) 80 is provided in the output stage of the second pulse-width adjusting section 8. High and low levels of a signal output from the second pulse-width adjusting section 8 are set to Vd (a source voltage)/0 (a ground level) (see arrow B in FIG. 6).

As previously described, the first and second pulse-width adjusting sections 6 and 8 perform more accurate control operations as there is a higher degree of similarity of circuit configuration between them. For this reason, these pulse-width adjusting sections are made up of identical or substantially identical circuits. Specifically, the first and second pulse-width adjusting sections 6 and 8 are mounted on a common semiconductor substrate.

More specifically, it is desirable to form the first and second pulse-width adjusting sections 6 and 8 from a completely identical circuit. Therefore, these pulse-width adjusting sections are fabricated in an integrated circuit such that they are arranged into an identical or geometrically symmetrical layout on a common semiconductor substrate (i.e., a common substrate is shared between the first and second pulse-width adjusting sections 6 and 8). As a result, variations in the pulse width of the signals due to temporal changes in source voltage arising in electrical wiring connected to the power source, the ground, or the like.

Figure 7:
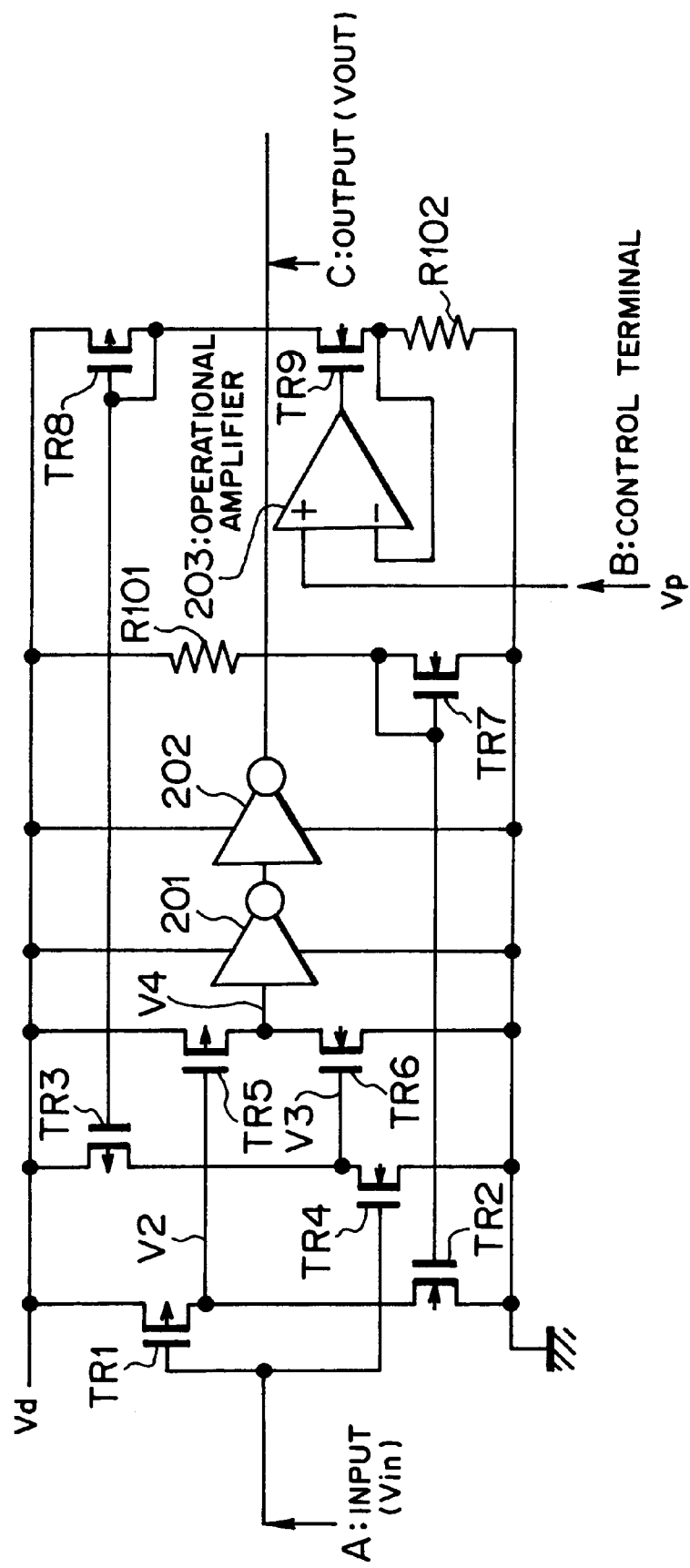
FIG. 7 is a circuit diagram illustrating a pulse-width adjusting section of the first embodiment of the present invention.

As illustrated in FIG. 7 (see Japanese Patent Application Laid-Open (kokai) No. 6-291626), the first and second pulse-width adjusting sections 6 and 8 are each comprised of; e.g., P-channel MOS transistors (hereinafter referred to as PMOS transistors) TR1, TR3, TR5, and TR8; N-channel MOS transistors (hereinafter referred to as NMOS transistors) TR2, TR4, TR6, TR7, and TR9; inverters 201 and 202; an operational amplifier 203; and resistors R101 and R102. If a signal having a certain pulse width (Vin) is input to the pulse-width controller (see arrow A in FIG. 7), the pulse width of that signal is controlled according to a voltage (Vp) input from the control terminal (see arrow B in FIG. 7), thereby outputting a signal (Vout) having a target pulse width (see arrow C in FIG. 7). More specifically, the first and second pulse-width adjusting sections 6 and 8 are arranged such that the CMOS logic circuit 80 are provided at least in the output stage of the pulse-width adjusting sections.

In order to effect the previously described operations, the first and second pulse-width adjusting sections 6 and 8 have the following circuit configuration:

Namely, a signal input from the outside enters the gates of the PMOS transistor TR1 and the NMOS transistor TR4. A source-drain line of the PMOS transistor TR1 and a source-drain line of the NMOS transistor TR2 are connected in series with each other. The source of the PMOS transistor TR1 is connected to the source voltage, whereas the source of the NMOS transistor TR2 is grounded.

A drain-source line of the PMOS transistor TR3 and a drain-source line of the NMOS transistor TR4 are connected in series with each other. The source of the PMOS transistor TR3 is connected to the source voltage, whereas the source of the NMOS transistor TR4 is grounded.

Further, a source-drain line of the PMOS transistor TR5 and a drain-source line of the NMOS transistor TR6 are connected in series with each other. The source of the PMOS transistor TR5 is connected to the source voltage, whereas the source of the NMOS transistor TR6 is grounded. The gate of the PMOS transistor TR5 is connected to the drain of the PMOS transistor TR1, and the gate of the NMOS transistor TR6 is connected to the drain of the NMOS transistor TR4.

Inverters 201 and 202 are connected to a ground as well as to the source voltage. A junction between the drain of the PMOS transistor TR5 and the drain of the NMOS transistor TR6 is connected to an input terminal of the inverter 201. An output terminal of the inverter 201 is connected to an input terminal of the inverter 202. The inverter 202 outputs a signal (Vout) to the outside.

The resistor R101 and a drain-source line of the NMOS transistor TR7 are connected in series with each other, and one end of the resistor R101 that is not connected to the NMOS transistor TR7 is connected to the source voltage. The source of the NMOS transistor TR7 is grounded. The gate and drain of the NMOS transistor TR7 are connected together, and the gate of the NMOS transistor TR7 is connected to the gate of the NMOS transistor TR2. As a result, a current-mirror circuit is formed by the NMOS transistors TR7 and TR2.

A source-drain line of the PMOS transistor TR8, a drain-source line of the NMOS transistor TR9, and the resistor R102 are connected in series with each other. The source of the PMOS transistor TR8 is connected to the source voltage, and one end of the resistor R102 that is not connected to the NMOS transistor TR9 is grounded. The gate and drain of the PMOS transistor TR8 are connected together, and the gate of the PMOS transistor TR8 and the gate of the PMOS transistor TR3 are connected together. As a result, a current-mirror circuit is formed by the PMOS transistor TR8 and the PMOS transistor TR3.

One input terminal (+) of the operational amplifier 203 is connected to the control terminal, whereas the other input terminal (−) of the same is connected to a junction between the source of the NMOS transistor TR9 and the resistor R102. Further, an output terminal of the operational amplifier 203 is connected to the gate of the NMOS transistor TR9. The first and second pulse-width adjusting sections 6 and 8 having the aforementioned circuit configuration are fabricated in an integrated circuit such that they are arrayed into an identical or geometrically symmetrical layout on a common semiconductor substrate.

With such a circuit configuration, provided that the source voltage (Vd) is 3V; that the threshold voltages of the NMOS transistor and PMOS transistor are respectively set to 1 volt; and that the resistor R101 is set to 10 kΩ, an electrical current of 200 µA flows into the source-drain of the NMOS transistor TR7. If the input signal (Vin) is "0 (based on the assumption that the circuit operates in positive logic)"=low, the PMOS transistor TR1 turns on, so that a current of 200 µA substantially equivalent to the current flowing into the NMOS transistor TR7 flows into the NMOS transistor TR2.

Provided that the resistor R102 is set to 5 kΩ; and that the voltage (Vp) of the control terminal is set to 1V, as a result of operation of the operational amplifier 203, a voltage of 1V is applied to the resistor R102, and a current of 200 µA flows through the resistor R102. The current of 200 µA flows through a source-drain line of the PMOS transistor TR8 via the NMOS transistor TR9. If the input signal is "1 (based on the assumption that the circuit operates in positive logic)"= high, the NMOS transistor TR4 turns on, so that a current of 200 µA substantially equivalent to the current flowing into the PMOS transistor TR8 flows through the PMOS transistor TR3.

Figure 8:
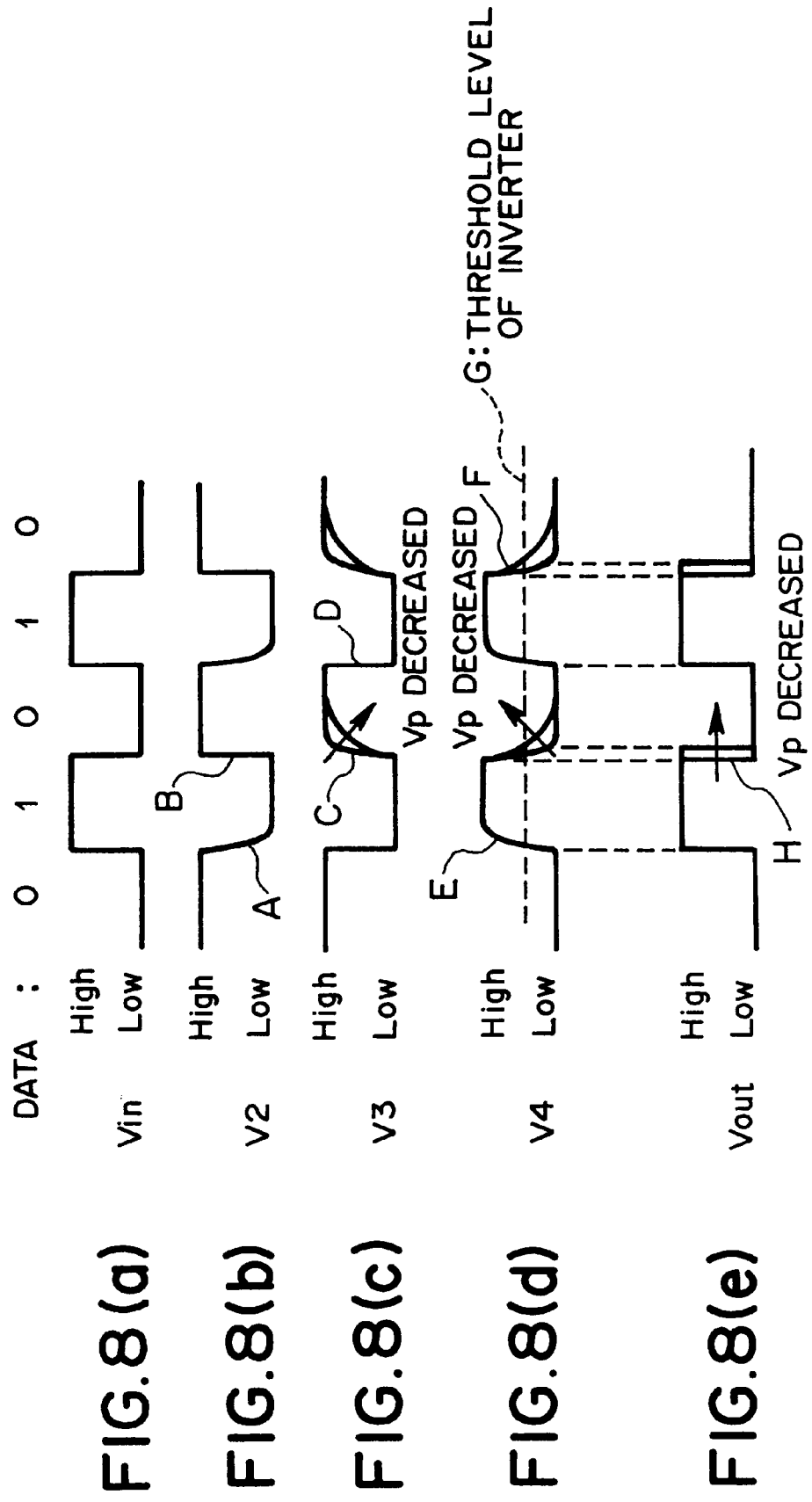
FIGS. 8(*a*) to 8(*e*) are timing charts for explaining the pulse-width adjusting section of the first embodiment of the present invention.

For a case where the input signal is modulated according to positive logic; namely, a logical 1 (represented by the high voltage level) and a logical 0 (represented by the low voltage level), since the PMOS transistor turns off when the input signal (Vin in FIG. 8(a)) switches from a logical 0 to a logical 1, the level of a voltage V2 also changes from a logical 1 to a logical 0.

At this time, an electrical charge accumulated in the parasitic capacitance of the gate of the PMOS transistor TR5 is discharged via the NMOS transistor TR2. Accordingly, the NMOS transistor TR2 acts as a constant-current source due to the current mirror effect so as to limit the discharge of the electrical charge, as a result: of which the voltage V2 falls slowly (see arrow A in FIG. 8(b)).

In contrast, when the input signal changes from a logical 1 to a logical 0, the PMOS transistor TR1 turns on, so that the voltage V2 changes from a logical 0 to a logical 1. At this time, a charging current flowing into the gate of the PMOS transistor TR5 is supplied not from the NMOS transistor TR2 of the constant current source but from the PMOS transistor TR1 in an ON condition. Therefore, the voltage V2 rises fast (see arrow B in FIG. 8(b)).

When the input signal changes from a logical 1 to a logical 0, the NMOS transistor TR4 turns off, so that the voltage V3 changes from a logical 0 to a logical 1 as illustrated in FIG. 8(c). At this time, the parasitic capacitance of the NMOS transistor TR6 or the like is charged with an electrical charge from the PMOS transistor TR3. Even in this case, the PMOS transistor TR3 acts as a constant-current source due to the current mirror effect so as to limit the charging of the electrical charge, as a result of which the voltage V3 rises slowly (see arrow C in FIG. 8(c)).

If the voltage Vp of the control terminal falls, the current flowing through the PMOS transistor TR3 reduces, so that the voltage V3 rises more slowly. Conversely, if the voltage Vp of the control terminal rises, the current flowing through the PMOS transistor TR3 increases, so that the voltage V3 rises quickly.

In contrast, when the input signal changes from a logical 0 to a logical 1, the PMOS transistor TR4 turns on, whereby the level of the voltage V3 changes from a logical 1 to a logical 0. At this time, the electrical current is discharged from the parasitic capacitance of the NMOS transistor TR6 by way of not the PMOS transistor TR3 which serves as a constant current source but of the PMOS transistor TR4 in an ON state, as a result of which the voltage V3 falls quickly (see arrow D in FIG. 8(c)).

As illustrated in FIG. 8(d), a waveform of the voltage V4 input to the inverter 201 has a less steep leading edge (see arrow E in FIG. 8(d)) and a less steep trailing edge (see arrow F in FIG. 8(d)) by means of the PMOS transistor TR5 and the NMOS transistor TR6 controlled by the voltages V2 and V3. Even in this case, if the voltage Vp of the control terminal is reduced, the voltage falls more slowly. A dotted line G provided in FIG. 8(d) designates a threshold level (an electric potential) of the inverters 201 and 202 in the subsequent stage.

As illustrated in FIG. 8(e), the voltage (Vout) output from the previously-described inverter 202 changes from a logical 0 to a logical 1 when the input signal changes from a logical 0 to a logical 1. When the input signal changes from a logical 1 to a logical 0, the output voltage changes from a logical 1 to a logical 0. If the level of the voltage (Vp) of the control terminal is reduced, the voltage V4 falls slower compared to the case where it rises. As a result of this, the pulse width of the output signal (Vout) becomes wide (see arrow H in FIG. 8(e)). Conversely, when the level of the voltage (Vp) of the control terminal is increased, the voltage 4 falls slowly compared to the case where it rises. As a result, the pulse width of the output signal (Vout) becomes narrow.

As has been described above, the pulse width of the input signal can be changed by changing the level of the voltage (Vp) of the control terminal.

The pulse-width measurement section 9 illustrated in FIG. 5 receives an output from the second pulse-width adjusting section 8 and measures a pulse width of the clock signal controlled by the second pulse-width adjusting section 8 (i.e., pulse-width information; see arrow F in FIG. 5). As illustrated in FIG. 6, the pulse-width measurement section 9 is provided with a low-pass filer (an RC low-pass filer) 90. A voltage V5 output from the low-pass filter 90 is associated with the pulse width Tp of the clock signal by Equation (1) as shown below. Therefore, if the voltage V5 is obtained, the pulse width Tp of the clock signal can be measured.

$$Tp=2 \cdot V5/Vd \cdot Tts \quad (1)$$

where Tp is the pulse width of the clock signal, Vd is a source voltage, and Tts is a time slot.

The target pulse-width setting section 4 is used to set a target pulse width to be achieved by the first pulse-width adjusting section 6 and, as shown in FIG. 6, has a resistance-type voltage divider 40 which produces a voltage corresponding to a target pulse width. The resistance-type voltage divider 40 has voltage dividing resisters R1 and R2 for dividing the source voltage (Vd) into a voltage V6 corresponding to a target pulse width. The source voltage Vd designates the voltage of a power source of the pulse-width controller.

If one of the voltage dividing resistors R1 and R2 of the resistance-type voltage divider 40, i.e., the resistor R2 is changed to a variable resistor (see arrow D in FIG. 6), it becomes possible to control the pulse width of the voltage. If at least one of the resistors R1 and R2 is made up of a thermistor, it becomes possible to change the pulse of the voltage according to temperature.

As a result, it is possible to constantly control the pulse width of a resultant optical signal without being affected by temperature by compensating for variations in the pulse width of an optical pulse signal output from the LD 71 caused by temperature.

The voltage V6 obtained as an output of the target pulse-width control setting section 4 is expressed by Equation (2).

$$V6=Vd \cdot R2/(R1+R2) \quad (2)$$

where R1 and R2 designate voltage dividing resistors. Accordingly, if the voltage dividing ratio provided by the resistor R1 and the resistor R2 is changed, the target pulse width can be changed.

The comparison device 5a constitutes the control section 5. On the basis of the information regarding the pulse width of the clock signal measured by the pulse-width measurement section 9 and the target pulse width information set by the target pulse-width setting section 4, the control section 5 outputs to the first pulse-width adjusting section 6 a control signal used in controlling the pulse width of the data signal by the first pulse-width adjusting section 6. Specifically, the comparison device 5a outputs, as a control signal, information regarding the difference between the output information (V5) from the pulse-width measurement section 9 and the target pulse width information (V6) set by the target pulse width setting section 4. The information regarding the difference is obtained by a differential amplifier (a differential amplifying circuit) using an unillustrated operational amplifier.

That is, when the output information (V5) from the pulse-width measurement section 9 and the target pulse width information (V6) from the target pulse width setting section 4 are input to the comparison device 5a, the comparison device 5a carries out a control to provide a feedback to the control terminal (voltage input) of the second pulse-width adjusting section 8 based on the two kinds of pieces of pulse width information, and the difference between the two kinds of pieces of pulse width information is output to the first pulse-width adjusting section 6 as a control signal.

The pulse-width information (a control signal) output from the comparison device 5a is expressed by the following Equation.

$$Tp=2 \cdot R2/(R1+R2) \cdot Tts \quad (3)$$

As described above, the control signal output from the comparison device 5a is generated and output according to the pulse width of the clock signal having a stable signal pattern "10101 . . . " and the target pulse-width information set by the target pulse-width setting section 4. As a result, the first pulse-width adjusting section 6 allows more accurate control of the pulse width.

As illustrated in FIG. 5, by virtue of the foregoing circuit configuration, the data signal input to the pulse-width controller 60 of the first embodiment of the present invention enters the first pulse-width adjusting section 6. The pulse width of the data signal is controlled by use of a control signal received from the comparison device 5a via the control terminal of the first pulse-width adjusting section 6. Then, the data signal (in the form of an electrical signal) is converted into an optical signal by the first electrical-optical signal conversion section 7. The thus-converted signal is output to the outside as a modulated light signal via an optical fiber or the like.

At this time, the pulse-width control signal input to the control terminal of the first pulse-width adjusting section 6 is produced in the following manner. More specifically, a clock signal used in inputting the data signal is subjected to frequency division by the frequency divider 20. The second pulse-width adjusting section 8 adjusts the pulse width of the frequency-divided clock signal according to the feedback signal (a control signal) received from the comparison device 5a.

Subsequently, the pulse width of the clock signal controlled by the second pulse-width adjusting section 8 is measured by the pulse-width measurement section 9, and the result of such measurement is input to the comparison device 5a as pulse-width information. The comparison device 5a compares the pulse-width information received from the pulse-width measurement section 9 with the target pulse-width information received from the target pulse-width setting section 4. Information regarding the difference between them is output as a control signal to the first pulse-width adjusting section 6 and is fed back to the second pulse-width adjusting section 8.

As has been described above, by virtue of the pulse-width controller 60 of the first embodiment of the present invention, the pulse width of the data signal can be controlled by the second pulse-width adjusting section 8 that is provided so as to simulate the first pulse-width adjusting section 6. Consequently, precise pulse-width control operations become feasible regardless of the environment of the pulse-width controller at the time of the pulse-width control operations, thereby contributing to improved performance of the pulse-width controller.

The pulse width of the data signal can be controlled by use of the information regarding the difference between the pulse-width information obtained from the pulse width of the clock signal used in inputting the data signal and the target pulse-width information, thereby enabling more precise pulse-width control.

It is possible to cause the second pulse-width adjusting section 8 to simulate the first pulse-width adjusting section 6 by controlling the pulse width of the clock signal by feeding back the control signal output from the comparison device 5a (a comparator circuit). As a result, more accurate control of the pulse width of the data signal can be achieved by causing the control signal to follow the pulse width to be output. Even in this case, the performance of the pulse-width controller is greatly improved.

(b1) Description of a Modification of the First Embodiment

Although the pulse-width measurement section 9 receives an output from the second pulse-width adjusting section 8 in the first embodiment and measures the pulse width of the clock signal (i.e., the reference pulse-width signal), there can be interposed between the second pulse-width adjusting section 8 and the pulse-width measurement section 9 a second electrical-optical signal conversion section 21 for converting into an optical signal the output information from the second pulse-width adjusting section 8, and an electrical-optical signal conversion section 22 for converting into an electrical signal the optical signal received from the second electrical-optical signal conversion section 21.

Figure 9:
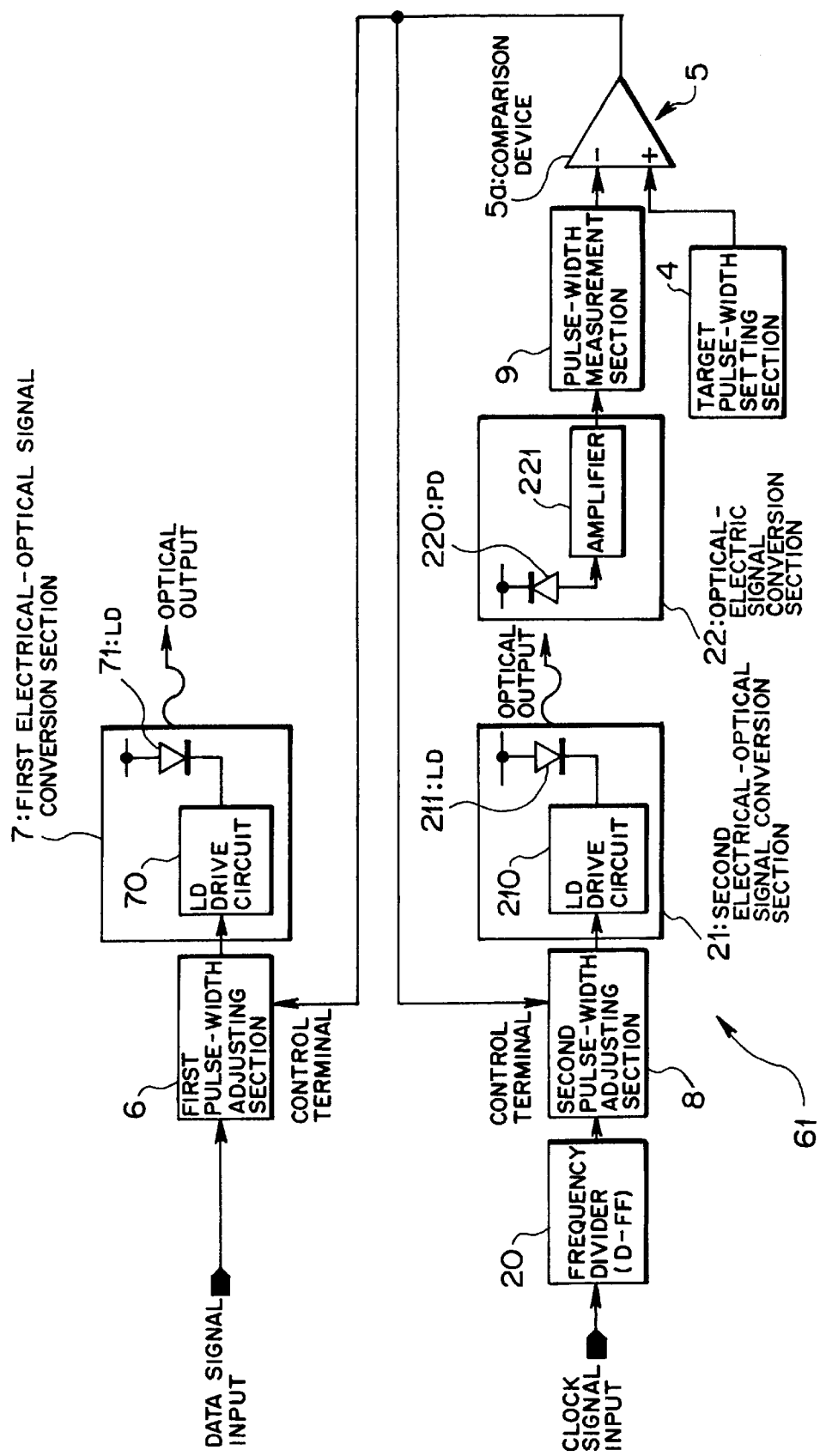
FIG. 9 is a block diagram illustrating a modification of the pulse-width controller of the first embodiment of the present invention.

In a pulse-width controller 61 illustrated in FIG. 9, the second electrical-optical signal conversion section 21 is made up of an LD drive circuit 210 for driving the laser diode (LD), and a laser diode (LD) 211 which serves as a light-emitting element for converting an electrical signal into an optical signal by a drive current received from the LD drive circuit 210. The optical-electrical signal conversion section 22 is comprised of a photodiode (PD) 220 which serves as a light-receiving element for converting into an electrical signal the optical signal received from the second electrical-optical signal conversion section 21, and an amplifier 221 for amplifying the electrical signal received from the PD 220.

An output (or an electrical signal) signal originating from the second pulse-width adjusting section 8 is input to the LD drive circuit 210 of the second electrical-optical signal conversion section 21, so that a drive voltage is applied to the LD 211. The signal is then converted into an optical signal by the LD 211, and the optical signal is output as a modulated light signal. The PD 220 of the optical-electrical signal conversion section 22 receives the thus-modulated light signal and converts the thus-received signal into an electrical signal. The electrical signal is amplified by the amplifier 221 and then output to the pulse-width measurement section 9. Subsequently, the signal is then subjected to the same processing as that of the previously-described pulse-width controller 60 illustrated in FIG. 5.

As illustrated in FIG. 9, the second electrical-optical signal conversion section 21 and the optical-electrical signal conversion section 22 are interposed between the second pulse-width adjusting section 8 and the pulse-width measurement section 9. As a result, it is possible to cause the processing carried out by the second pulse-width adjusting section 8 and the second electrical-optical signal conversion section 21 to simulate the processing carried out by the first pulse-width adjusting section 6 and the first electrical-optical signal conversion section 7. There can be corrected the dependency of the pulse-width controller, including the characteristics of the LD 211 with respect to temperature and power source (or the degree of influence of temperature and power source).

(c) Description of a Second Embodiment

Figure 10:
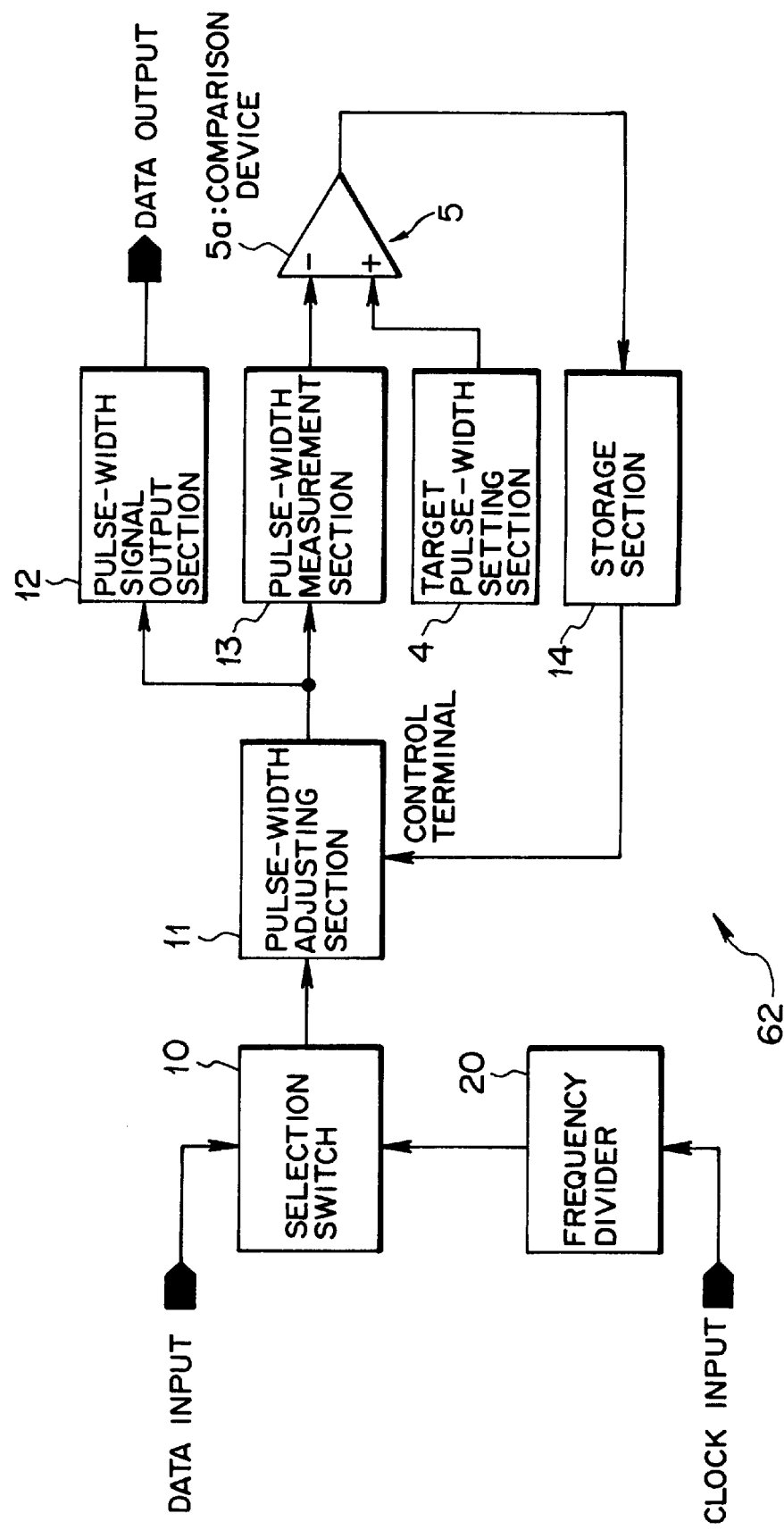
FIG. 10 is a block diagram illustrating the configuration of a pulse-width controller according to a second embodiment of the present invention.
Figure 11:
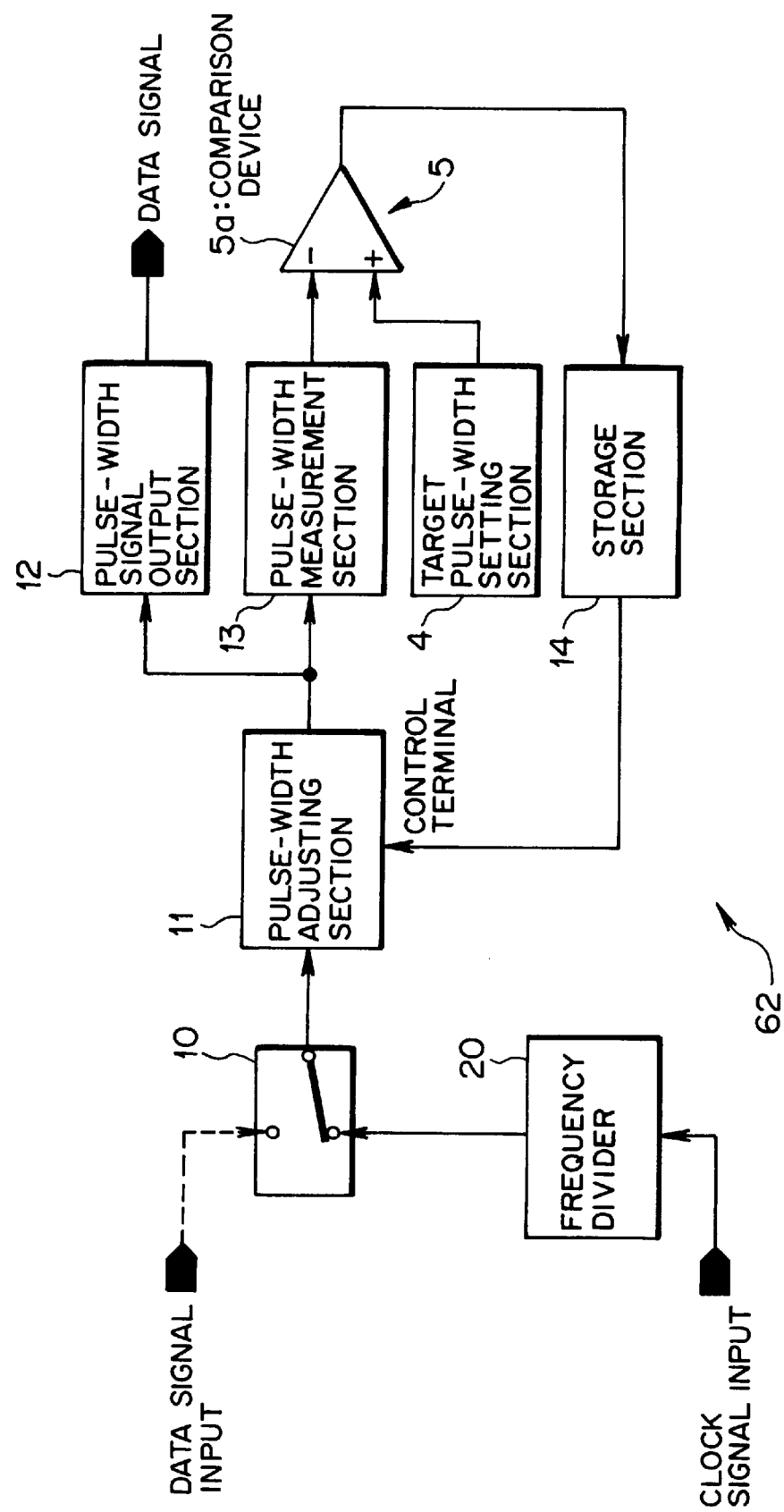
FIG. 11 is a diagram for explaining the operation of the pulse-width controller of the second embodiment of the present invention.

FIG. 10 is a block diagram illustrating the configuration of a pulse-width controller according to a second embodiment of the present invention. A pulse-width controller 62 illustrated in FIG. 10 is comprised of the target pulse-width setting section 4, the comparison device 5a, a selection switch 10, a pulse-width adjusting section 11, a pulse-width signal output section 12, a pulse-width measurement section 13, a storage section 14, and the frequency divider 20. Other previously-described reference numerals designate the same or substantially the same elements as those described above, and hence their explanations will be omitted here.

The selection switch 10 enables selective output of either the data signal (or the main pulse signal) or the clock signal (or the reference pulse signal) and is made up of; e.g., a selector circuit. At the time of setting of the pulse-width information, upon reception of a changeover signal, the selection switch 10 performs a switching operation so as to allow input of the clock signal and outputs the pulse width of the clock signal to the pulse-width adjusting section 11 following the selection switch 10. In the normal condition (at the time of controlling of the pulse width of the signal), upon reception of the changeover signal, the selection switch 10 performs a switching operation so as to allow input of the data signal and outputs the pulse width of the data signal to the pulse-width adjusting section 11 following the selection switch 10.

The pulse-width adjusting section 11 receives either the data signal or the clock signal selectively output from the selection switch 10 and adjusts the pulse width of the thus-received signal. The pulse-width adjusting section 11 is controlled by use of a control signal (or the pulse-width control information stored in the storage section 14 which will be described later) received from the control terminal of the pulse-width adjusting section 11. The pulse-width adjusting section 11 is the same as the previously-described first and second pulse-width adjusting sections 6 and 8.

The pulse-width signal output section 12 is capable of allowing external output of the pulse-width adjusting section 11. For example, the output can be output to the outside from an external output terminal. The pulse-width measurement section 13 receives an output from the pulse-width adjusting section 11 and measures the pulse width of the pulse signal adjusted by the pulse-width adjusting section 11. The result of such measurement is output to the comparison device 5a in the form of pulse-width information.

The storage section 14 is capable of storing a control signal (a preset value) received from the comparison device 5a and outputting the thus-stored control signal to the pulse-width adjusting section 11. For example, the storage section 14 is made up of memory, RAM or the like. Even in this case, as in the first embodiment, the control signal received from the comparison device 5a is fed back to the pulse-width adjusting section 11 via the storage section 14, thereby enabling precise control of the difference between the clock signal and the data signal with regard to pulse width.

In the pulse-width controller 62 of the second embodiment of the present invention, at the time of setting of the pulse-width information, the clock signal is subjected to frequency division of the frequency divider 20, and the thus-frequency-divided clock signal is output to the selection switch 10. The thus-output signal enters the pulse-width adjusting section 11 via the selection switch 10 switched to the clock-signal input side.

Subsequently, the pulse-width adjusting section 11 adjusts the pulse width of the clock signal according to the control signal (or the pulse-width information) which is the control signal output from the comparison device 5a and is stored in the storage section 14 and which is received from the storage section 14 via the control terminal. The pulse width of the pulse signal adjusted by the pulse-width adjusting section 11 is measured by the pulse-width measurement section 13. The result of such measurement is output to the comparison device 5a as the pulse-width information.

The comparison device 5a compares the pulse-width information received from the previously-described pulse-width measurement section 13 and the target pulse-width information output from the pulse-width setting section 4, so that the control signal (or information regarding the difference between them) is stored in the storage section 14.

Figure 12:
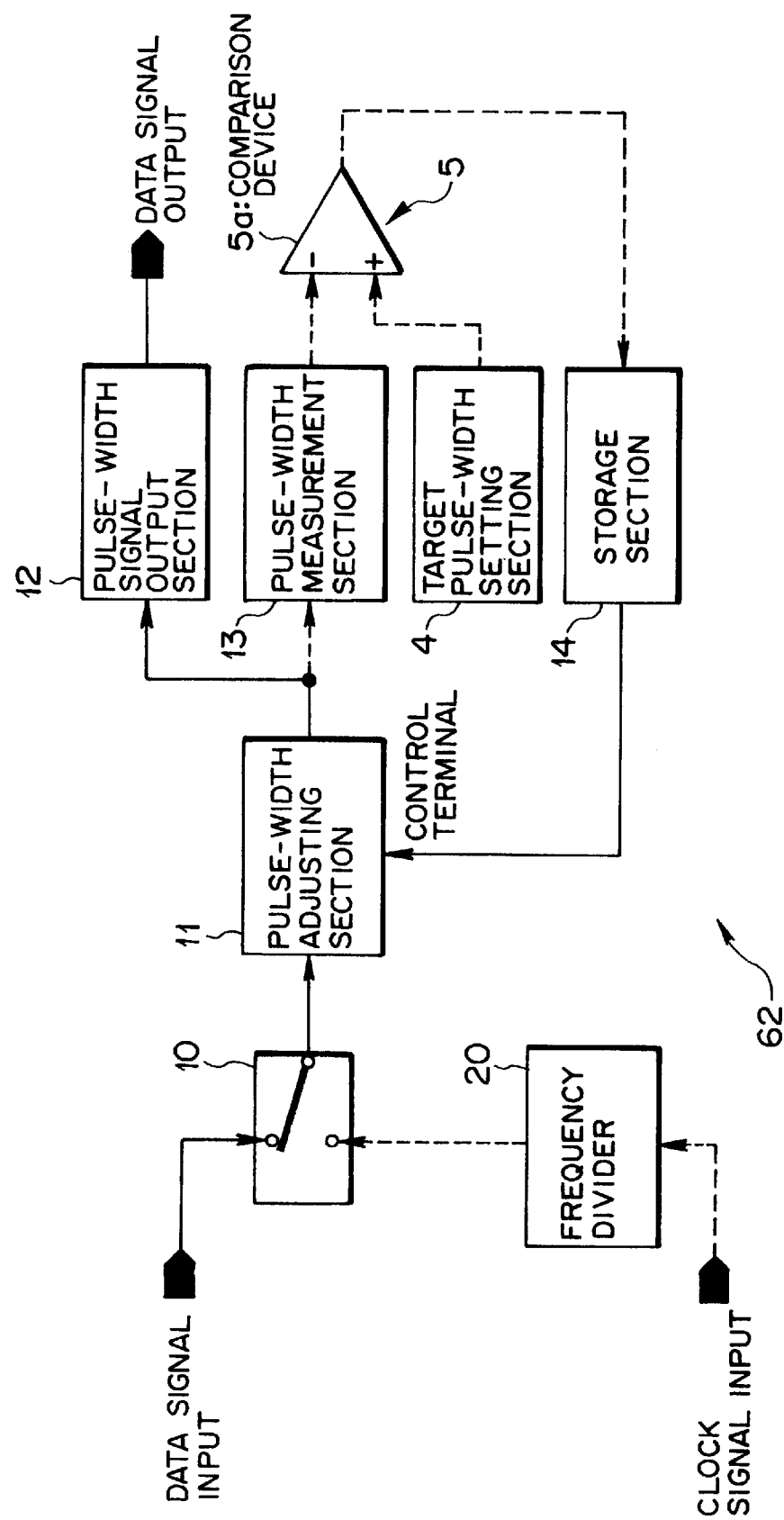
FIG. 12 is another diagram for explaining the operation of the pulse-width controller of the second embodiment of the present invention.

In contrast, in normal times, the selection switch 10 is switched, as illustrated in FIG. 12. When the data signal is input, the data signal is input to the pulse-width adjusting section 11 via the selection switch 10 switched to the data signal input side. Subsequently, the pulse-width adjusting section 11 adjusts the pulse width of the data signal according to the control signal received from the storage section 14 via the control terminal (or the information regarding the difference between the pulse-width information received from the pulse-width measurement section 13 and the target pulse-width information received from the target pulse-width setting section 4). The data signal is then output to the outside from the pulse signal output section 12.

When the pulse-width controller is reset (or the information stored in the storage section is updated), the selection switch 10 is switched to the clock signal input side, so that the previously-described processing is effected.

As has been described above, in the pulse-width controller 62 of the second embodiment, one pulse-width adjusting section; i.e., the pulse-width adjusting section 11, adjusts the pulse widths of the clock signal and the data signal. Therefore, it is possible to control the pulse width of the signal without being affected by the individual difference of the pulse-width adjusting section itself, and the circuit configuration of the pulse-width controller can be made compact.

Further, the control signal output originating from the comparison device (a comparing circuit) 5a is stored in the storage section 14, and the clock signal can be controlled by feeding back the thus-stored information. As in the first embodiment, the pulse width of a signal can be controlled more accurately by causing the control signal to follow the pulse width to be output. Consequently, the performance of the pulse-width controller is greatly improved.

(c1) Description of a Modification of the Second Embodiment

In the second embodiment, at the time of setting of the pulse-width information, the pulse-width measurement section 13 receives an output from the pulse-width adjusting section 11 and obtains pulse-width information. In normal times, upon reception of an output from the pulse-width adjusting section 11, the pulse-width signal output section 12 outputs the thus-received output to the outside. In contrast, as illustrated in FIG. 13, the electrical-optical signal conversion section 17 and the optical-electrical signal conversion section 18 may be provided subsequent to the pulse-width adjusting section 16.

Figure 13:
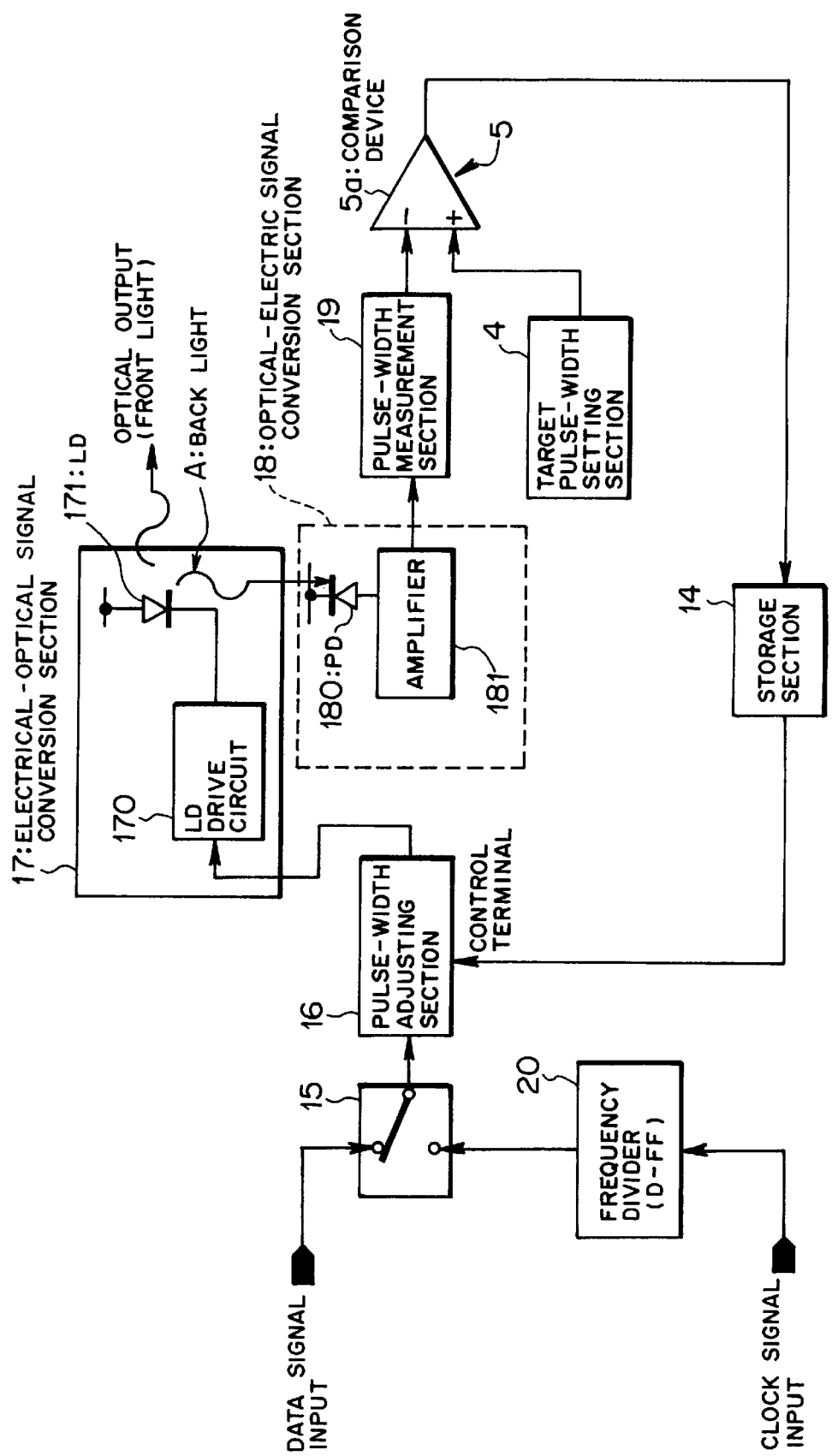
FIG. 13 is a block diagram illustrating a modification of the pulse-width controller of the second embodiment of the present invention.

In a pulse-width controller 63 illustrated in FIG. 13, the electrical-optical signal conversion section 17 is comprised of an LD drive circuit 170 and an LD 171. These elements have the same features as those of the previously-described LD drive circuit 210 and LD 211.

The optical-electrical signal conversion section 18 is comprised of a PD 180 and an amplifier 181. These elements also have the same features a, those of the previously-describe light-emitting element 220 and amplifier 221. The optical-electrical signal conversion section 18 converts into an optical signal an optical signal (front light) received from the front side of the LD 171 for output purposes (or a signal to be output to the outside in the form of an optical data signal). The optical-electrical signal conversion section 18 also converts into an optical signal an optical signal (back light; see arrow A in FIG. 13) received from the rear side of the LD 171 for pulse-width control purposes (or an optical signal for use in producing a control signal to be output to the pulse-width adjusting section 16).

In short, when a clock signal enters the pulse-width controller 63, the PD 180 receives the back light (for pulse-width control purposes) output from the LD 171. In contrast, when a data signal enters the pulse-width controller 63, the front light (for output purposes) is output to the outside from the LD 171.

Therefore, at the time of setting of the pulse-width information, the clock signal enters the pulse-width controller 63, and an output signal (or an electrical signal) originating from the pulse-width adjusting section 16 is input to the LD drive circuit 170 of the optical-electrical signal conversion section 17, so that a drive current is applied to the LD 171. Of the modulated light rays, the back light is received by the PD 180 of the optical-electrical signal conversion section 18. Subsequently, the thus-received light is converted into an electrical signal by the PD 180. The resultant electrical signal is amplified by the amplifier 181 and is output to the pulse-width measurement section 19. The signal is then subjected to the same processing as that performed in the second embodiment.

In contrast, in normal times, if the data signal enters the pulse-width controller 63 by selecting the selection switch 15, the pulse-width adjusting section 16 adjusts the pulse width of the data signal according to the control signal stored in the storage section 14. The data signal is then converted into an optical signal by the electrical-optical signal conversion section 17, and the optical signal is output to the outside.

More specifically, in the pulse-width controller 63 illustrated in FIG. 13, the electrical-optical signal conversion section 17 and the optical-electrical signal conversion section 18 are provided such that they follow the pulse-width adjusting section 16. Accordingly, it is possible to correct medium/long-term variations in pulse width due to temperature, power source voltage, or individual difference of the pulse-width controller, including the characteristics of the LD 171.

(d) Description of a Third Embodiment

Figure 14:
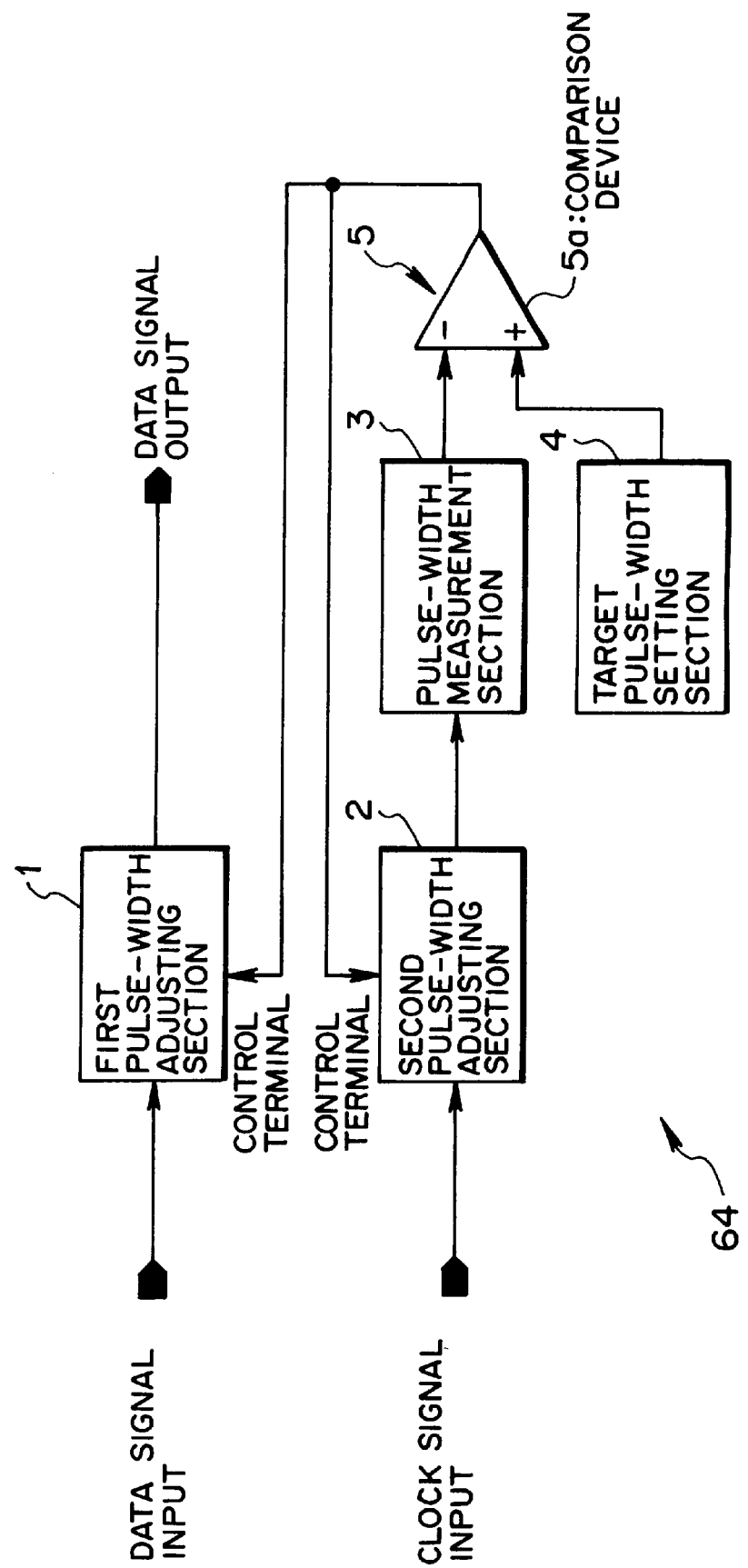
FIG. 14 is a block diagram illustrating the configuration of a pulse-width controller according to a third embodiment of the present invention.
Figure 15:
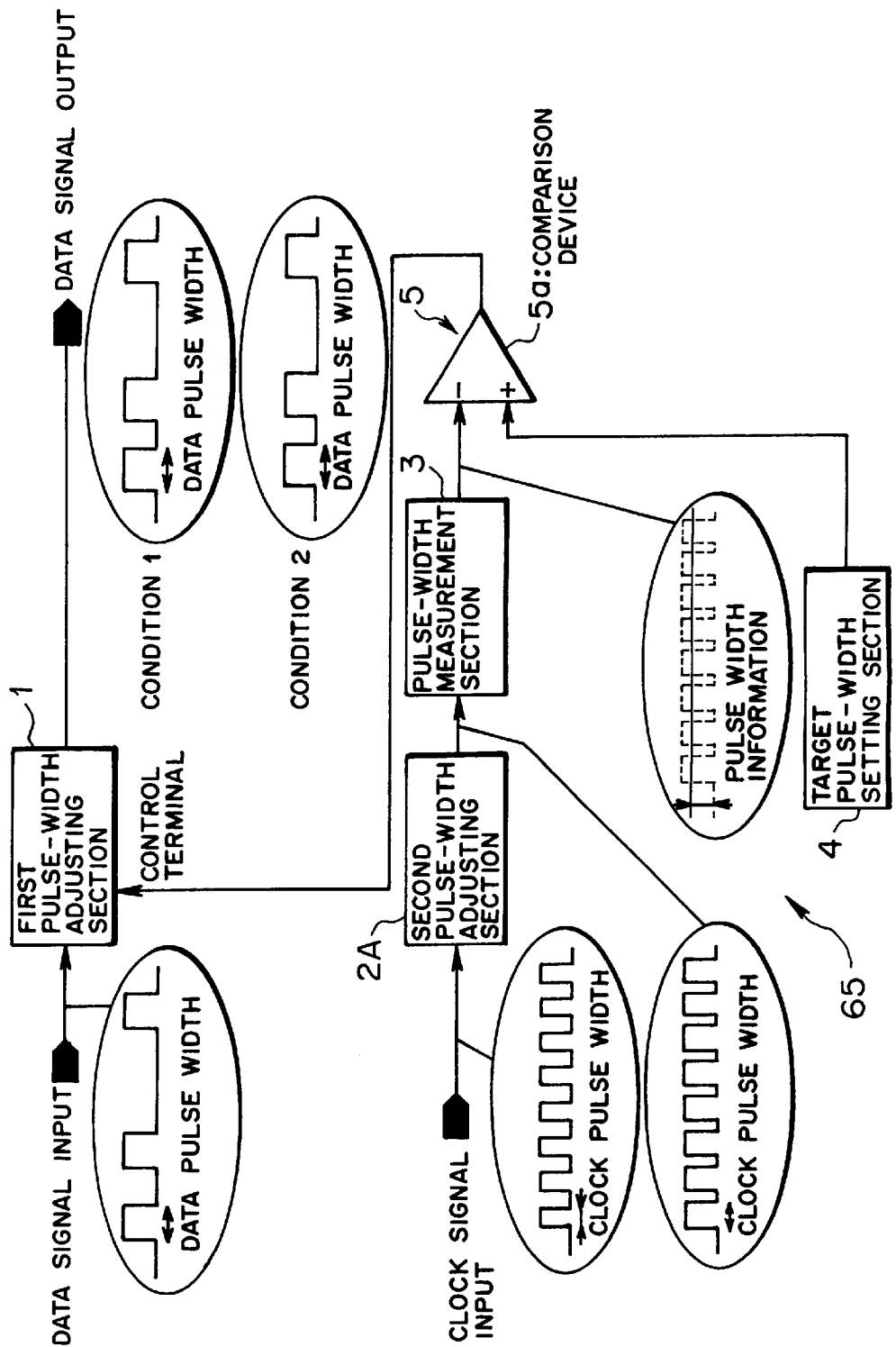
FIG. 15 is a block diagram illustrating a modification of the pulse-width controller of the third embodiment of the present invention.
Figure 16:
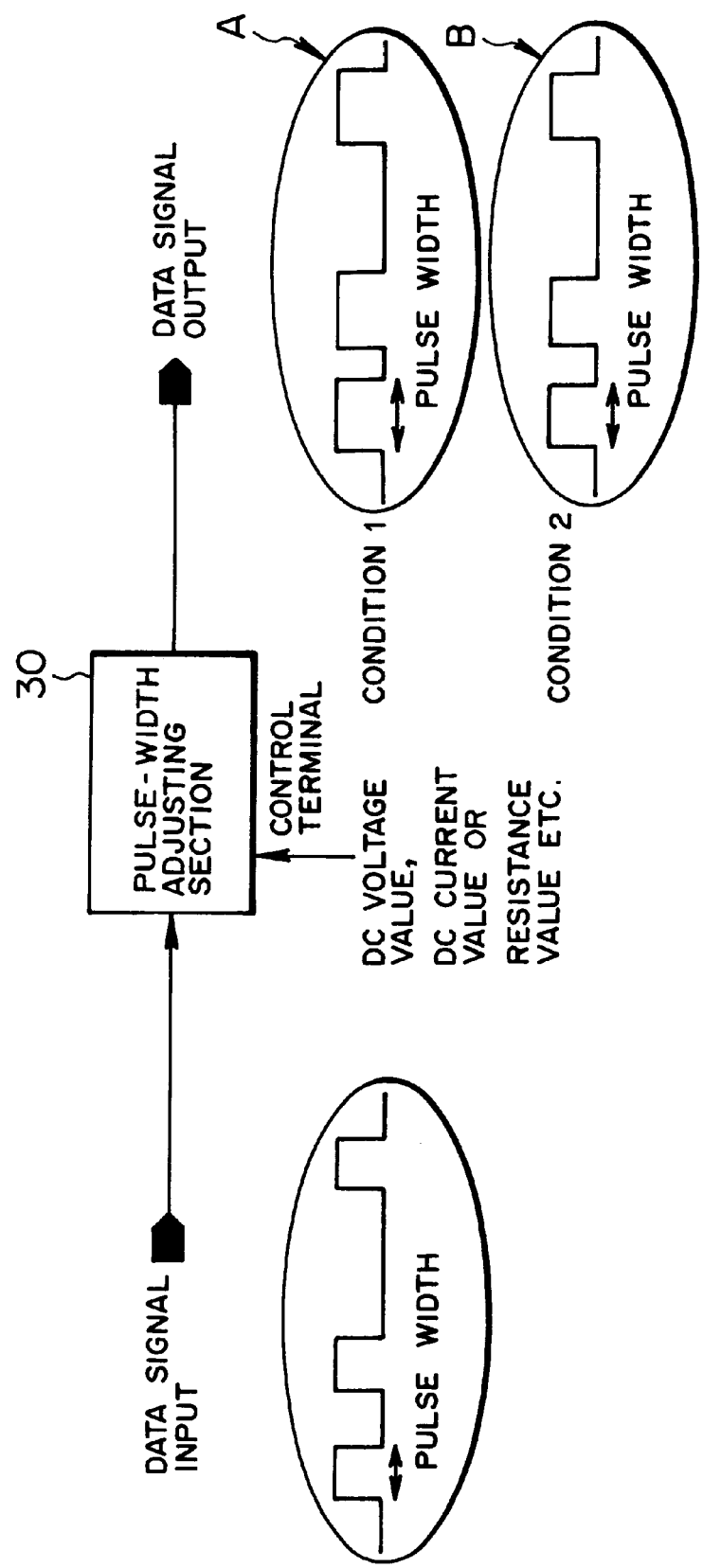
FIG. 16 is a diagram for explaining the operation of a common pulse-width controller.
Figure 17:
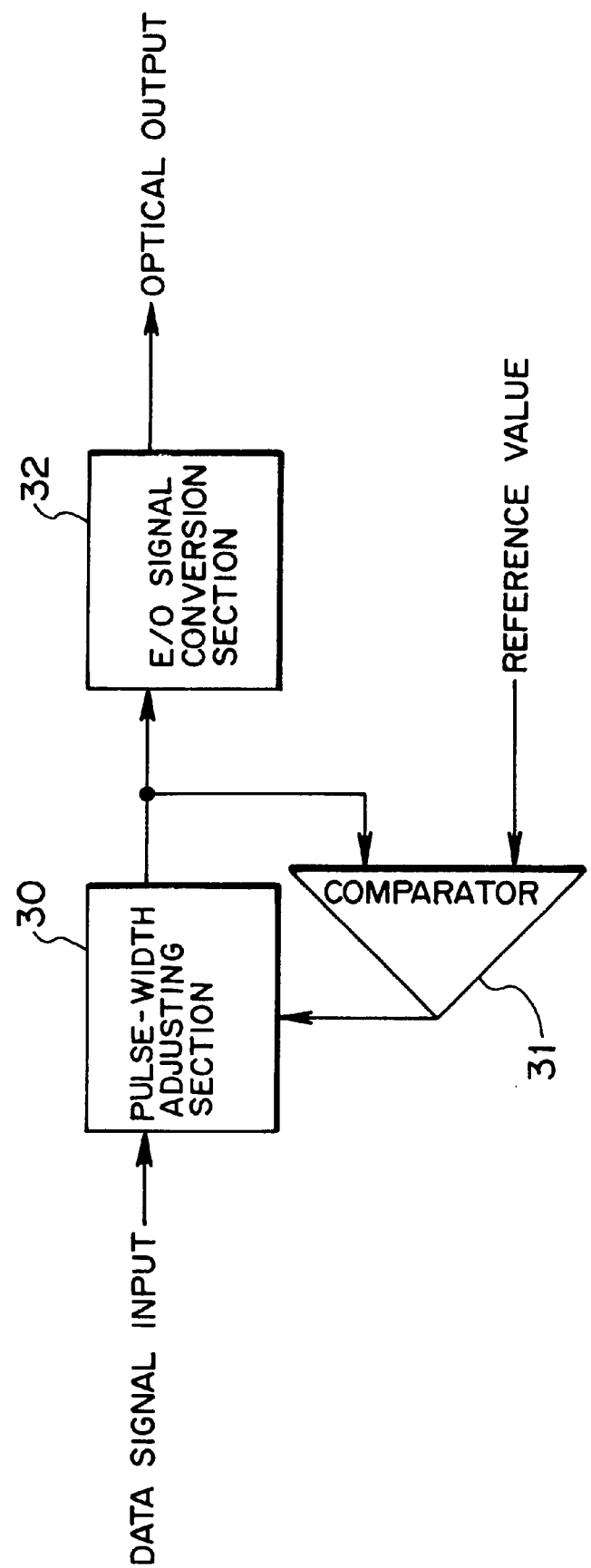
FIG. 17 is a block diagram illustrating the configuration of the common pulse-width controller.

FIG. 14 is a block diagram illustrating the configuration of a pulse-width controller according to a third embodiment of the present invention. The pulse-width controller 64 illustrated in FIG. 14 is comprised of a first pulse-width adjusting section 1, a second pulse-width adjusting section 2, a pulse-width measurement section 3, the target-pulse-width setting section 4, and the comparison device 5a. In short, the pulse-width controller 64 is equivalent to the pulse-width controller 60 of the first embodiment from which the first electrical-optical signal conversion section 7 is omitted. Therefore, the pulse-width controller 64 of this embodiment can be applied to a system which does not convert an input data signal (an electrical signal) into an optical signal. Accordingly, even in the system that does not convert an input signal into an optical signal, the pulse width of the input data can be controlled according to the control signal received from the comparison device 5a, thereby achieving the same advantages as those obtained by the first embodiment.

(d1) Description of a Modification of the Third Embodiment

In the third embodiment, a detailed explanation has been given of the second pulse-width adjusting section 8 that adjusts the pulse width of the clock signal by feeding back the control signal received from the comparison device 5a. However, the present invention can be applied to a pulse-width controller 65 having a second pulse-width adjusting section 2A which does not feed back the control signal received from the comparison device 5. In this case, the pulse width of the signal is controlled by fixing the level of a control signal received from a control terminal of the second pulse-width adjusting section 2A; i.e., the voltage (Vp) of the control terminal as illustrated in FIG. 7.

As described above, the pulse width of the clock signal input to the pulse-width controller is controlled by the second pulse-width adjusting section 2A according to the control signal (i.e., the fixed value). The signal is then subjected to the same processing as is in the previous embodiments. Subsequently, the pulse width of the data signal is controlled by the first pulse-width adjusting section 1 according to the control signal output from the comparison device 5.

Therefore, the second pulse-width adjusting section 2A that does not feed back the control signal received from the comparison device 5 can be also greatly improved with regard to the accuracy of pulse-width control.

(e) Others

Although the CMOS logic circuit is provided in an output stage of the pulse-width adjusting section in the respective embodiments, for example, an ECL (Emitter-coupled Logic) circuit may be provided instead of the CMOS logic circuit. In this case, so long as the target pulse-width setting value of the target pulse-width setting section 4 is set to an appropriate value, the pulse-width controller can be used in the same way as do the pulse-width controllers of the previous embodiments.

Although the resistor-type voltage divider 40 for use with a source voltage is used as the target pulse-width setting section 4, a constant-voltage source utilizing a Zener diode, a BGR (Band Gap Reference), or the like may be used as the target pulse-width setting section 4.

What is claimed is:

1. A pulse-width controller, comprising:

first pulse-width adjusting section adjusting a pulse-width of a main pulse signal upon reception thereof;

a second pulse-width adjusting section adjusting a pulse-width of a reference pulse signal upon reception thereof;

a pulse-width measurement section, upon reception of an output signal from said second pulse-width adjusting section, measuring the pulse-width of said reference pulse signal adjusted by said second pulse-width adjusting section;

a target pulse-width setting section setting a target pulse-width to be achieved by said first pulse-width adjusting section; and a control section coupled to said pulse-width measurement section and said target pulse-width setting section to output to said first pulse-width adjusting section a control signal for use in adjusting the pulse-width of said main pulse signal in said first pulse-width adjusting section, based on said reference pulse signal measured in said pulse-width measurement section and said target pulse-width set by said target pulse-width setting section.

2. A pulse-width controller according to claim 1, wherein said main pulse signal is a data signal, and said reference pulse signal is a clock signal.

3. A pulse-width controller according to claim 1, wherein upon reception of a feedback signal, as said control signal, from said control section, said second pulse-width adjusting section adjusts the pulse width of said reference pulse signal.

4. A pulse-width controller according to claim 1, wherein said first pulse-width adjusting section and said second pulse-width adjusting section are formed by at least substantially identical circuits.

5. A pulse-width controller according to claim 4, wherein said first pulse-width adjusting section and said second pulse-width adjusting section are disposed on the same semiconductor substrate.

6. A pulse-width controller according to claim 1, wherein said pulse-width measurement section comprises a low-pass filer.

7. A pulse-width controller according to claim 1, wherein an output stage of said pulse-width adjusting section is formed into a CMOS logic circuit, and said pulse-width measurement section comprises a low-pass filer.

8. A pulse-width controller according to claim 1, wherein said target pulse-width setting section comprises a power source circuit that generates a voltage corresponding to said target pulse-width.

9. A pulse-width controller according to claim 8, wherein said power source circuit of said target pulse-width setting section comprises a constant voltage source and a resistor-type voltage divider circuit for dividing a voltage of said constant voltage source into a voltage corresponding to said target pulse-width.

10. A pulse-width controller according to claim 9, wherein said voltage divider circuit in said power source circuit of said target pulse-width setting section includes a thermistor.

11. A pulse-width controller according to claim 9, wherein said voltage divider circuit in said power source circuit of said target pulse-width setting section comprises a variable resistor.

12. A pulse-width controller according to claim 1, wherein said control section comprises a comparing circuit for outputting, as said control signal, a difference between output levels from said pulse-width measurement section and said target pulse-width set by said target pulse-width setting section.

13. A pulse-width controller according to claim 12, wherein said comparing circuit comprises a differential amplifier circuit.

14. A pulse-width controller according to claim 1, further comprising a frequency divider for dividing a frequency of said reference pulse signal input to said second pulse-width adjusting section.

15. A pulse-width controller, comprising:
a first pulse-width adjusting section adjusting a pulse-width of a main electrical pulse signal upon reception thereof;
a first electrical-optical signal conversion section coupled to said first pulse-width adjusting section for converting into an optical signal said pulse-width adjusted by said first pulse-width adjusting section;
a second pulse-width adjusting section adjusting a pulse-width of a reference electrical pulse signal upon reception thereof;
a pulse-width measurement section, upon reception of an output signal from said second pulse-width adjusting section, measuring said pulse-width of said reference pulse signal adjusted by said second pulse-width adjusting section;
a target pulse-width setting section setting a target pulse-width to be achieved by said first pulse-width adjusting section; and
a control section coupled to said pulse-width measurement section and said target pulse-width setting section to output to said first pulse-width adjusting section a control signal for use in adjusting the pulse-width of said main electrical pulse signal in said first pulse-width adjusting section, based on said reference electrical pulse signal measured in said pulse-width measurement section and said target pulse-width information set by said target pulse-width setting section.

16. A pulse-width controller according to claim 15, wherein said main electrical pulse signal is a transmission data signal, and said reference electrical pulse signal is a clock signal.

17. A pulse-width controller according to claim 15, wherein upon reception of a feedback signal, as said control signal, from said control section, said second pulse-width adjusting section adjusts the pulse width of said reference electrical pulse signal.

18. A pulse-width controller according to claim 15, wherein said first pulse-width adjusting section and said second pulse-width adjusting section are formed by at least substantially identical circuits.

19. A pulse-width controller according to claim 18, wherein said first pulse-width adjusting section and said second pulse-width adjusting section are disposed on the same semiconductor substrate.

20. A pulse-width controller according to claim 15, wherein said pulse-width measurement section comprises a low-pass filer.

21. A pulse-width controller according to claim 15, wherein an output stage of said pulse-width adjusting section is formed into a CMOS logic circuit, and said pulse-width measurement section comprises a low-pass filer.

22. A pulse-width controller according to claim 15, wherein said target pulse-width setting section comprises a power source circuit that generates a voltage corresponding to said target pulse-width.

23. A pulse-width controller according to claim 22, wherein said power source circuit of said target pulse-width setting section comprises a constant voltage source and a resistor-type voltage divider circuit for dividing a voltage of said constant voltage source into a voltage corresponding to said target pulse-width.

24. A pulse-width controller according to claim 23, wherein said voltage divider circuit in said power source circuit of said target pulse-width setting section includes a thermistor.

25. A pulse-width controller according to claim 23, wherein said voltage divider circuit in said power source circuit of said target pulse-width setting section comprises a variable resistor.

26. A pulse-width controller according to claim 15, wherein said control section comprises a comparing circuit for outputting, as said control signal, a difference between output levels from said pulse-width measurement section and said target pulse-width set by said target pulse-width setting section.

27. A pulse-width controller according to claim 26, wherein said comparing circuit comprises a differential amplifier circuit.

28. A pulse-width controller according to claim 15, further comprising a frequency divider for dividing a frequency of said reference electrical pulse signal input to said second pulse-width adjusting section.

29. A pulse-width controller according to claim 15, further comprising a second electrical-optical signal conversion section coupled between said second pulse-width adjusting section and said pulse-width measurement section, for converting said output signal of said second pulse-width adjusting section into an optical signal, and an optical-electrical signal conversion section for converting the optical signal received from said second electrical-optical signal conversion section into an electrical signal.

30. A pulse-width controller according to claim 15, wherein said first electrical-optical signal conversion section is composed of a first light-emitting element and a first light-emitting element drive section for driving said first light-emitting element.

31. A pulse-width controller according to claim 30, wherein said first light-emitting element is formed by a semiconductor laser.

32. A pulse-width controller according to claim 29, wherein said second electrical-optical signal conversion section is composed of a second light-emitting element and a second light-emitting element drive section for driving said second light-emitting element.

33. A pulse-width controller according to claim 32, wherein said second light-emitting element is formed a semiconductor laser.

34. A pulse-width controller according to claim 29, wherein said optical-electrical signal conversion section is composed of a third light-receiving element and an amplifier for amplifying an output of said light-receiving element.

35. A pulse-width controller according to claim 34, wherein said light-receiving element is formed by a photo-diode.

36. A pulse-width controller comprising:
   a selection switch selectively outputting one signal of a main pulse signal and a reference pulse signal;
   a pulse-width adjusting section coupled to said selection switch for adjusting a pulse-width of the selected one signal;
   a pulse signal output section coupled to said pulse-width adjusting section for generating an output data signal;
   a pulse-width measurement section, upon reception of an output signal from said pulse-width adjusting section, measuring the pulse-width adjusted by said pulse-width adjusting section;
   a target pulse-width setting section setting a target pulse-width to be achieved by said pulse-width adjusting section;
   a control section coupled to said pulse-width measurement section and said target pulse setting section for outputting a control signal for use in adjusting said pulse-width adjusting section, based on the pulse signal measured in said pulse-width measurement section and said target pulse-width set by said target pulse-width setting section; and
   a storage section for storing said control signal received from said control section and outputting the stored control signal to said pulse-width adjusting section.

37. A pulse-width controller according to claim 36, wherein said main pulse signal is a data signal, and said reference pulse signal is a clock signal.

38. A pulse-width controller according to claim 36, wherein said pulse-width measurement section comprises a low-pass filer.

39. A pulse-width controller according to claim 36, wherein an output stage of said pulse-width adjusting section is formed into a CMOS logic circuit, and said pulse-width measurement section comprises a low-pass filer.

40. A pulse-width controller according to claim 36, wherein said target pulse-width setting section comprises a power source circuit that generates a voltage corresponding to said target pulse-width.

41. A pulse-width controller according to claim 40 wherein said power source circuit of said target pulse-width setting section comprises a constant voltage source and a resistor-type voltage divider circuit for dividing the voltage of said constant voltage source into a voltage corresponding to said target pulse-width.

42. A pulse-width controller according to claim 41, wherein said voltage divider circuit in said power source circuit of said target pulse-width setting section includes a variable resistor.

43. A pulse-width controller according to claim 36, wherein said control section comprises a comparing circuit for outputting, as said control signal, a difference between output levels from said pulse-width measurement section and said target pulse-width set by said target pulse-width setting section.

44. A pulse-width controller according to claim 43, wherein said comparing circuit comprises a differential amplifier circuit.

45. A pulse-width controller according to claim 36, further comprising a frequency divider for dividing a frequency of said reference pulse signal input to said pulse-width adjusting section.

46. A pulse-width controller according to claim 41, wherein said voltage divider circuit in said power source circuit of said target pulse-width setting section includes a thermistor.

47. A pulse-width controller, comprising:
   a selection switch selectively outputting one signal of an electrical pulse signal and a reference electrical pulse signal;
   a pulse-width adjusting section coupled to said selection switch, for adjusting a pulse-width of said selected one signal;
   an electrical-optical signal conversion section for converting into an optical signal said selected one signal having said pulse-width adjusted by said pulse-width adjusting section;
   an optical-electrical signal conversion section for converting the optical signal received from said electrical-optical signal conversion section into an electrical signal;
   a pulse-width measurement section, upon reception of an output from said optical-electrical signal conversion section, measuring a pulse-width of the electrical signal;
   a target pulse-width setting section setting a target pulse-width to be achieved by said pulse-width adjusting section;
   a control section coupled to said pulse-width measurement section and said target pulse setting section for outputting a control signal for use in adjusting said pulse-width adjusting section, based on the electrical signal measured in said pulse-width measurement section and set by said target pulse-width setting section; and
   a storage section for storing said control signal received from said control section and outputting the stored control signal to said pulse-width adjusting section.

48. A pulse-width controller according to claim 47, wherein said main electrical pulse signal is a transmission data signal, and said reference electrical pulse signal is a clock signal.

49. A pulse-width controller according to claim 47, wherein said pulse-width measurement section comprises a low-pass filter.

50. A pulse-width controller according to claim 47, wherein an output stage of said pulse-width adjusting section is formed into a CMOS logic circuit, and said pulse-width measurement section comprises a low-pass filter.

51. A pulse-width controller according to claim 47, wherein said target pulse-width setting section comprises a power source circuit that generates a voltage corresponding to said target pulse-width.

52. A pulse-width controller according to claim 51, wherein said power source circuit of said target pulse-width setting section comprises a constant voltage source and a resistor-type voltage divider circuit for dividing the voltage of said constant voltage source into a voltage corresponding to said target pulse-width.

53. A pulse-width controller according to claim 52, wherein said voltage divider circuit in said power source circuit of said target pulse-width setting section includes a variable resistor.

54. A pulse-width controller according to claim 47, wherein said control section comprises a comparing circuit for outputting, as said control signal, a difference between output levels from said pulse-width measurement section and said target pulse-width set by said target pulse-width setting section.

55. A pulse-width controller according to claim 54, wherein said comparing circuit comprises a differential amplifier circuit.

56. A pulse-width controller according to claim 47, further comprising a frequency divider for dividing a frequency of said reference electrical pulse signal input to said pulse-width adjusting section.

57. A pulse-width controller according to claim 47, wherein said electrical-optical signal conversion section is composed of a light-emitting element and a light-emitting element drive section for driving said light-emitting element.

58. A pulse-width controller according to claim 57, wherein said light-emitting element is formed by a semiconductor laser.

59. A pulse-width controller according to claim 47, wherein said optical-electrical signal conversion section is composed of a light-receiving element and an amplifier for amplifying an output of said light-receiving element.

60. A pulse-width controller according to claim 59, wherein said light-receiving element is formed by a photodiode.

61. A pulse-width controller according to claim 52, wherein said voltage divider circuit in said power source circuit of said target pulse-width setting section includes a thermistor.

\* \* \* \* \*

UNITED STATES PATENT AND TRADEMARK OFFICE
CERTIFICATE OF CORRECTION

PATENT NO. :   5,914,622
DATED      :   June 22, 1999
INVENTOR(S):   Tadao INOUE It is certified that error appears in the above-identified patent and that said Letters Patent is hereby corrected as shown below:

Col. 23, line 5, after "formed" insert --by--.

Signed and Sealed this

Sixteenth Day of November, 1999

Attest:

Q. TODD DICKINSON

*Attesting Officer*    *Acting Commissioner of Patents and Trademarks*